United States Patent
Li et al.

(10) Patent No.: US 9,613,960 B2
(45) Date of Patent: Apr. 4, 2017

(54) FIN FIELD EFFECT TRANSISTORS AND FABRICATION METHOD THEREOF

(71) Applicant: Semiconductor Manufacturing International (Shanghai) Corporation, Shanghai (CN)

(72) Inventors: Yong Li, Shanghai (CN); Chengqing Wei, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/975,917

(22) Filed: Dec. 21, 2015

(65) Prior Publication Data

US 2016/0197075 A1  Jul. 7, 2016

(30) Foreign Application Priority Data

Jan. 6, 2015  (CN) .......................... 2015 1 0005174

(51) Int. Cl.
*H01L 27/092* (2006.01)
*H01L 21/8238* (2006.01)
*H01L 21/266* (2006.01)
*H01L 29/167* (2006.01)
*H01L 29/161* (2006.01)
*H01L 29/10* (2006.01)

(52) U.S. Cl.
CPC ........ *H01L 27/0924* (2013.01); *H01L 21/266* (2013.01); *H01L 21/823807* (2013.01); *H01L 21/823821* (2013.01); *H01L 29/1054* (2013.01); *H01L 29/161* (2013.01); *H01L 29/167* (2013.01)

(58) Field of Classification Search
CPC .............. H01L 27/0924; H01L 21/266; H01L 21/823807; H01L 29/1054; H01L 29/161; H01L 29/167

See application file for complete search history.

(56) References Cited

U.S. PATENT DOCUMENTS

| 2013/0270654 | A1  | 10/2013 | Toh et al. |
| 2015/0035023 | A1* | 2/2015  | Kim ...................... H01L 29/785 257/288 |
| 2015/0364593 | A1* | 12/2015 | Jangjian ................ H01L 29/785 257/401 |

* cited by examiner

*Primary Examiner* — Christine Enad
(74) *Attorney, Agent, or Firm* — Anova Law Group, PLLC

(57) ABSTRACT

A method for forming FinFETs includes providing a semiconductor substrate having at least a first fin in a first region and at least a second fin in a second region, and a first gate structure over the first fin and a second gate structure over the second fin; forming a first stress layer on the first fin and a first cover layer on the first stress layer; forming a second stress layer on the second fin and a second cover layer on the second stress layer; performing a first potential barrier reducing ion implantation process on the first cover layer; performing a second potential barrier reducing ion implantation process on the second cover layer; forming a first metal layer and a second metal layer; and forming a first contact layer on the first cover layer and a second contact layer on the second cover layer.

20 Claims, 13 Drawing Sheets

US 9,613,960 B2

FIN FIELD EFFECT TRANSISTORS AND FABRICATION METHOD THEREOF

CROSS-REFERENCES TO RELATED APPLICATIONS

This application claims the priority of Chinese patent application No. 201510005174.1, filed on Jan. 6, 2015, the entirety of which is incorporated herein by reference.

FIELD OF THE INVENTION

The present invention generally relates to the field of semiconductor manufacturing technology and, more particularly, relates to fin field effect transistors (FinFETs) and fabrication processes thereof.

BACKGROUND

With the continuous development of the semiconductor fabrication technologies and the continuous shrinking of the technical node, semiconductor devices have been experiencing a transition from the planar CMOS field effect transistors (MOSFETs) to the three dimensional fin field effect transistors (FinFETs). In a FinFET, the gate structure is able to control the channel region from two sides of the fin structure. Thus, comparing with MOSFETs, FinFETs have a significantly higher control ability to the channel regions; and are able to effectively inhibit the short-channel effects. Further, FinFETs also have a better compatibility with the existing integrated circuit (IC) manufacturing technologies.

FIGS. 1~6 illustrate structures corresponding certain stages of an existing fabrication process of FinFETs. As shown in FIGS. 1~2, at the beginning of the fabrication process, a semiconductor substrate (not labeled) is provided. FIG. 2 is a cross-sectional view of the structure illustrated in FIG. 1.

The semiconductor substrate has a PMOS region "A" and an NMOS region "B". A first fin 11a is formed on the semiconductor substrate in the PMOS region "A"; and a second fin 11b is formed on the semiconductor substrate in the NMOS region "B".

Specifically, the semiconductor substrate in the PMOS region "A" includes a silicon substrate 101a having at least two protruding structures; and an insulation layer 102a formed on the silicon substrate 101a between the protruding structures. The top surface of the insulation layer 102a is lower than the top surfaces of the protruding structures. The portion of the protruding structure higher than the top surface of the insulation layer 102a is configured as the first fin 11a.

The semiconductor substrate in the NMOS region "B" includes a silicon substrate 101b having at least two protruding structures; and an insulation layer 102b is formed on the silicon substrate 101b between the protruding structures. The top surface of the insulation layer 102b is lower than the top surfaces of the protruding structures. The portion of the protruding structure higher than the top surface of the insulation layer 102b is configured as the second fin 11b.

Further, after providing the semiconductor substrate having the first fin 11a and the second fin 11b, a gate structure 12 is formed over the first fin 11a and the second fin 11b. The gate structure 12 includes a gate oxide layer 121, and a gate layer 122 formed on the gate oxide layer 121.

Further, after forming the gate structure 12, a first sidewall material layer 13' is formed on the semiconductor substrate, the top and side surfaces of the first fin 11a in the PMOS region "A" of the semiconductor substrate; and on the semiconductor substrate, the top and side surfaces of the second fin 11b in NMOS region "B" of the semiconductor substrate. The first sidewall material layer 13' includes a silicon oxide layer (not labeled) on the bottom, and a silicon nitride layer (not labeled) formed on the silicon oxide layer.

Further, as shown in FIG. 2, after forming the first sidewall material layer 13', a LDD ion implantation process and a Halo ion implantation process are performed on the first fin 11a and the second fin 11b at both sides of the gate structure 12. After the ion implantation processes, a thermal annealing process is performed. Thus, LDD ion implanting regions and Halo ion implanting regions are formed in the first fin 11a and the second fin 11b at both sides of the gate structure 12.

Further, as shown in FIG. 3, after the LDD ion implantation process and the Halo ion implantation process, a second sidewall material layer (not shown) is formed on the first sidewall material layer 13'. The second sidewall material layer is made of silicon nitride.

Further, an etch-back process is performed on the first sidewall material layer 13' and the second sidewall material layer. Thus, a first fin sidewall spacer (not labeled) is formed around the first fin 11a; and a second fin sidewall spacer (not labeled) is formed around the second fin 11b.

Referring to FIG. 3, the first fin sidewall spacer includes a first oxide sidewall spacer 13a and a first nitride sidewall spacer 14a. The nitride sidewall spacer 14a includes the silicon nitride layer in the first sidewall spacer material layer 13', and the second sidewall spacer material layer.

The second fin sidewall spacer includes a second oxide sidewall spacer 13b and a second nitride sidewall spacer 14b. The nitride sidewall spacer 14b includes the silicon nitride layer in the first sidewall spacer material layer 13', and the second sidewall spacer material layer.

Further, a first patterned photoresist layer is formed on the top and side surfaces of the first fin 11a in the PMOS region "A". The first patterned photoresist layer exposes the NMOS region "B".

Further, a doped silicon carbide layer 15b is formed on the top surface of the second fin 11b by an in situ doping growth process. The doped silicon carbide layer 15b is used as the source and drain regions of an N-type FinFET. The silicon carbide layer 15b is doped with phosphorous ions.

Further, as shown in FIG. 4, a first silicon cap layer 16b is formed on the doped silicon carbide layer 15b by a surface epitaxial growth process. Then, the patterned photoresist layer is removed by a plasma ashing process.

Further, as shown in FIG. 5, a second patterned photoresist layer (not shown) may be formed on the NMOS region "B" and the first silicon cap layer 16b. The second patterned photoresist layer exposes the PMOS region "A". Then, the portions of the first fin 11a at both sides of the gate structure 12 are removed. The top surface of the remaining first fin 11a levels with the top surface of the insulation layer 102a.

Further, as shown in FIG. 6, a doped silicon germanium layer 15a is formed on the surface of the remaining first fin 11a by an in situ doping growth process. The doped silicon germanium layer 15a is used as the source and drain regions of a P-type FinFET. The doping ions are boron ions.

Further, after forming the doped silicon germanium layer 15a, a second silicon cap layer 16a is formed on the doped silicon germanium layer 15a. Then, the second patterned photoresist layer is removed.

Further, a first metal layer (not shown) is formed on the first silicon cap layer 16b; and a second metal layer (not shown) is formed on the second silicon cap layer 16a. Then, the first metal layer and the second metal layer are annealed. The first metal layer and the first silicon cap layer 16b are melt together to form a first metal silicide layer (not shown). The second metal layer and the second silicon cap layer 16a are formed together to form a second metal silicide layer (not shown).

However, the performance of the FinFETs formed by the existing methods often does not match desired requirements. The disclosed device structures and methods are directed to solve one or more problems set forth above and other problems.

BRIEF SUMMARY OF THE DISCLOSURE

One aspect of the present disclosure includes providing a method for fabricating a semiconductor structure having a plurality of the FinFETs. The method includes providing a semiconductor substrate having a first region and a second region; and forming at least a first fin on the semiconductor substrate in the first region and at least a second fin on the semiconductor substrate in the second region. The method also includes forming a first gate structure over the first fin and a second gate structure over the second fin; forming a first stress layer on the first fin at both sides of the first gate structure and a first cover layer on the first stress layer; and forming a second stress layer on the second fin at both sides of the second gate structure and a second cover layer on the second stress layer. Further, the method also includes performing a first potential barrier reducing ion implantation process on the first cover layer; and performing a second potential barrier reducing ion implantation on the second cover layer. Further, the method also includes forming a first metal layer on the first cover layer and a second metal layer on the second cover layer; and forming a first contact layer on the first cover layer and a second contact layer on the second cover layer f.

Another aspect of the present disclosure includes providing a semiconductor structure having a plurality of FinFETs. The semiconductor structure includes a semiconductor substrate having a first region and a second region; and at least a first fin formed on the semiconductor substrate in the first region and at least a second fin formed on the semiconductor substrate in the second region. The semiconductor structure also includes a first gate structure formed on the first fin and a second gate structure formed over the second fin; a first stress layer formed on the first fin at both sides of the first gate structure; and a second stress layer formed on the second fin at both sides of the second gate structure. Further, the semiconductor structure includes a first contact layer, of which a bottom interface has a first dipole layer, formed on the first stress layer; and a second contact layer, of which a bottom interface has a second dipole layer, formed on the second stress layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As mentioned previously, the performance of the FinFETs formed by the existing methods may be unable to match desired requirements. One reason may be that the parasitic resistance of the metal silicide layers formed on the source and drain regions may be significantly greater than the designed requirements. Accordingly, improved semiconductor structures and methods are provided.

Figure 20:
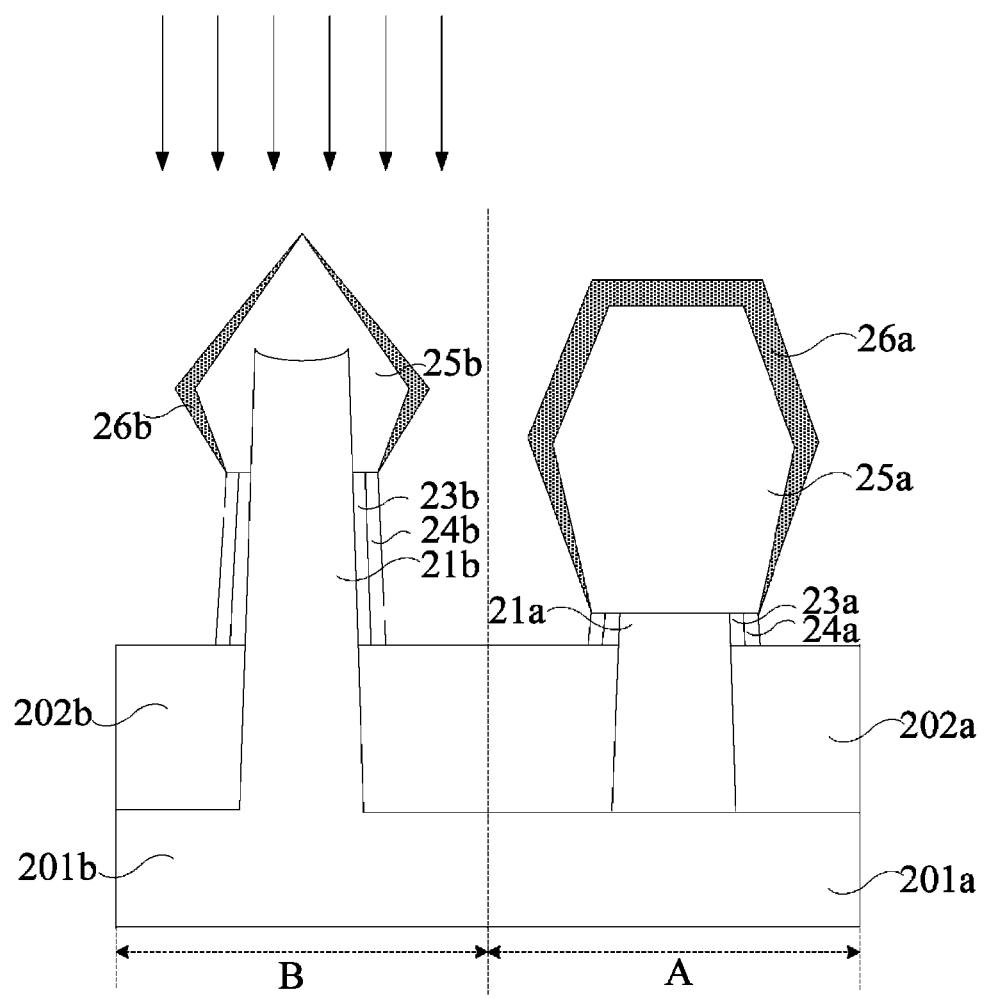
Figure 21:
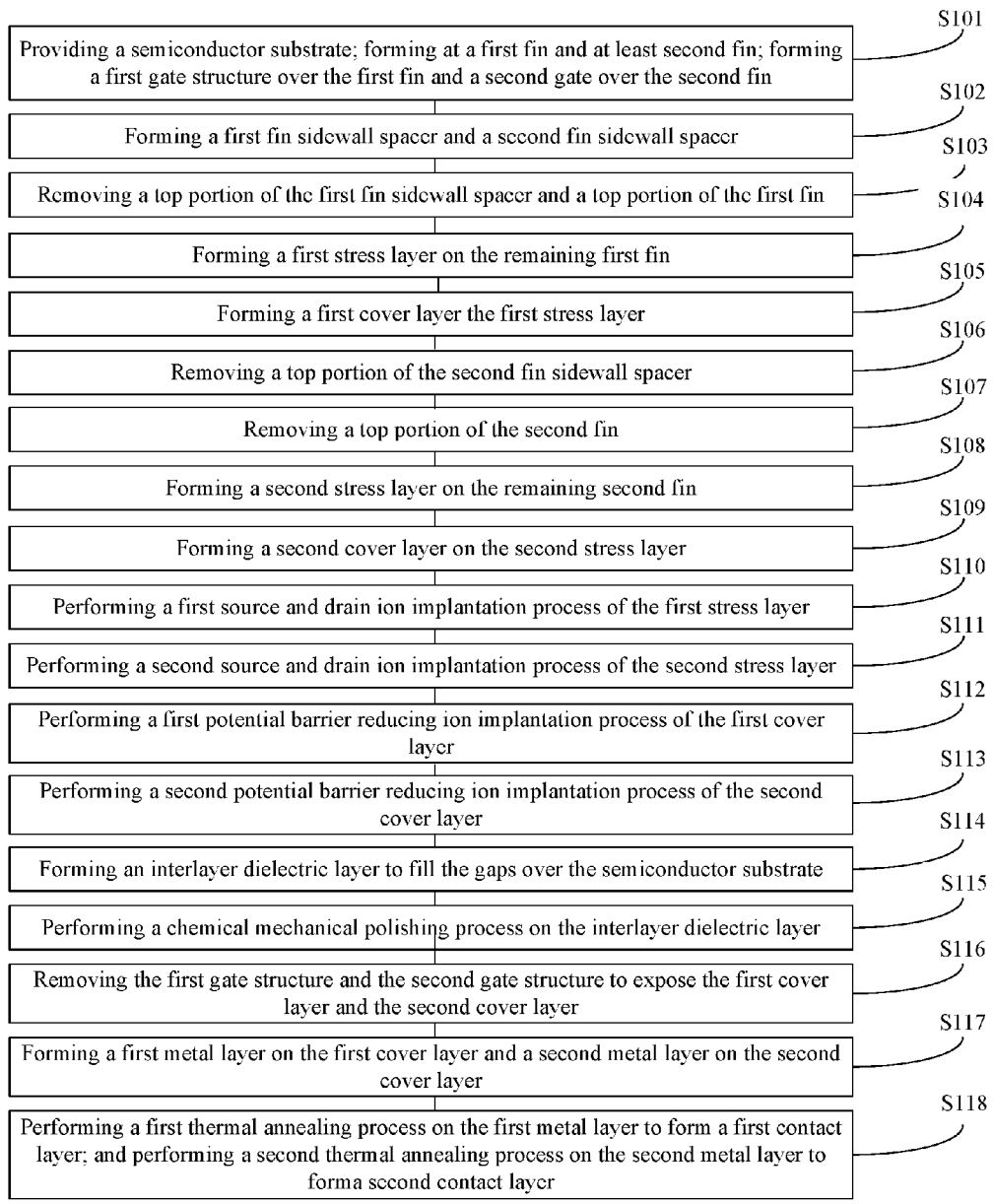
FIG. 21 illustrates an exemplary fabrication process of a semiconductor structure having a plurality of FinFETs consistent with the disclosed embodiments.

FIG. 21 illustrates an exemplary fabrication process of a semiconductor structure having a plurality of FinFETs consistent with the disclosed embodiments. FIGS. 7~20 illustrate semiconductor structures corresponding certain stages of the exemplary fabrication process.

Figure 1:
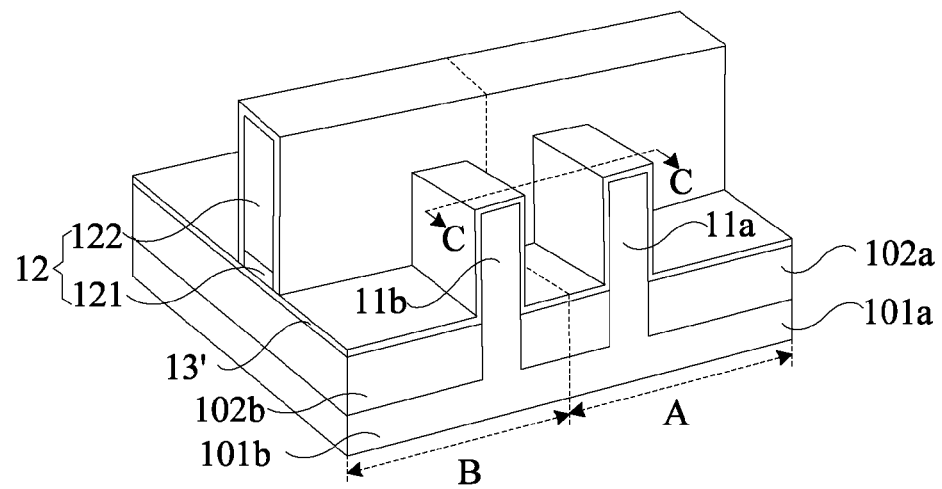
FIG. 1 illustrates a three-dimensional view of an existing semiconductor substrate having a PMOS region and an NMOS region and corresponding gate structures and sidewall spacers.
Figure 2:
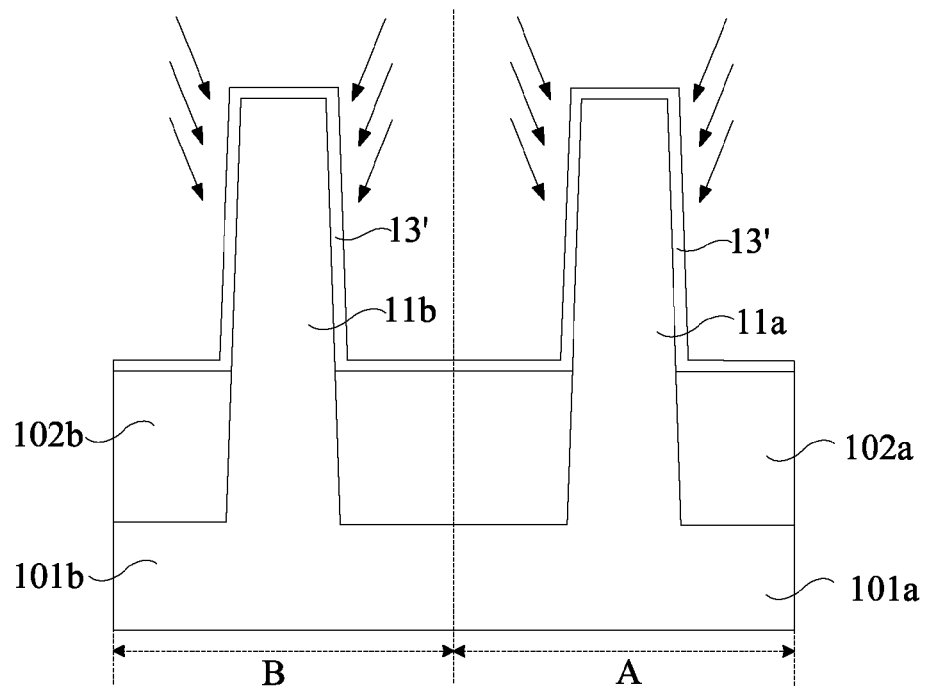
FIG. 2 illustrates a cross-sectional view of the structure illustrated in FIG. 1 along the CC direction.
Figure 3:
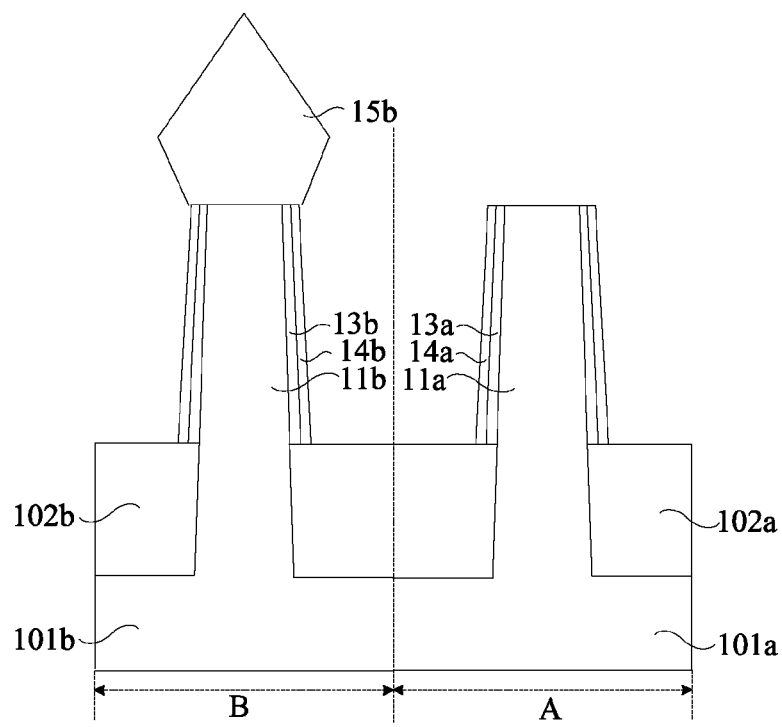
FIGS. 3~6 illustrate semiconductor structures corresponding certain stages of an existing fabrication process of FinFETs after the structure illustrated in FIG. 2.
Figure 4:
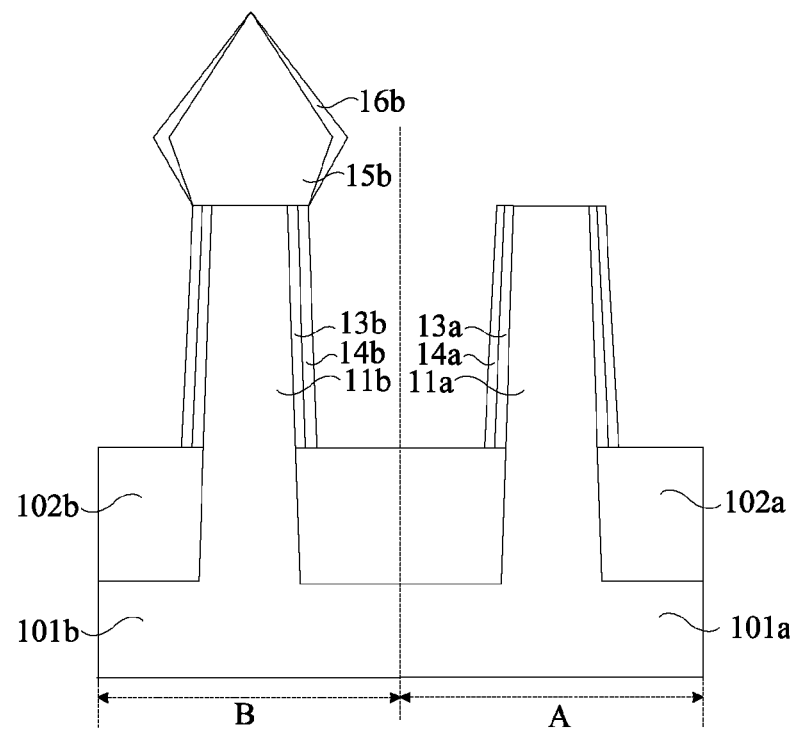
Figure 5:
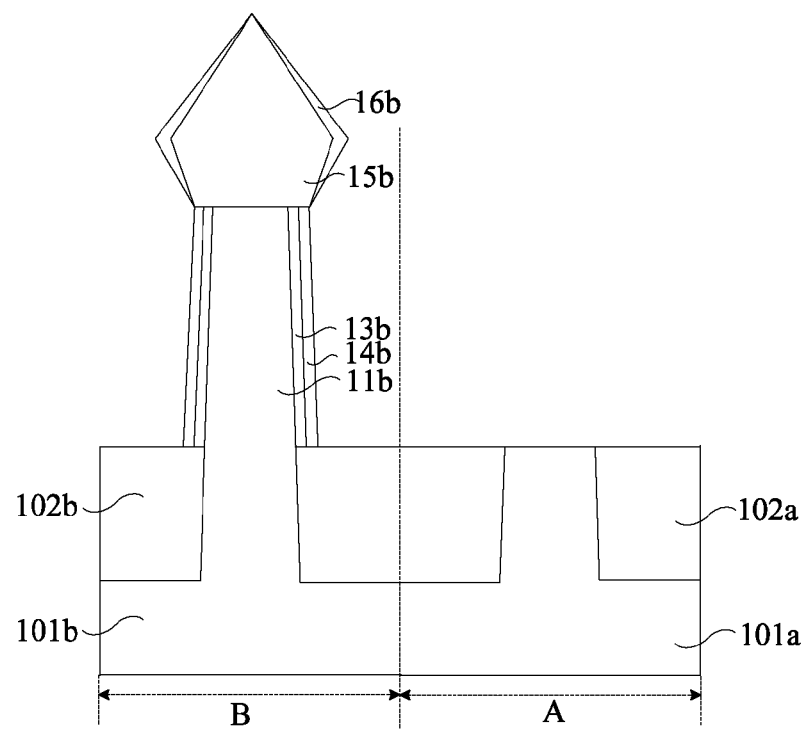
Figure 6:
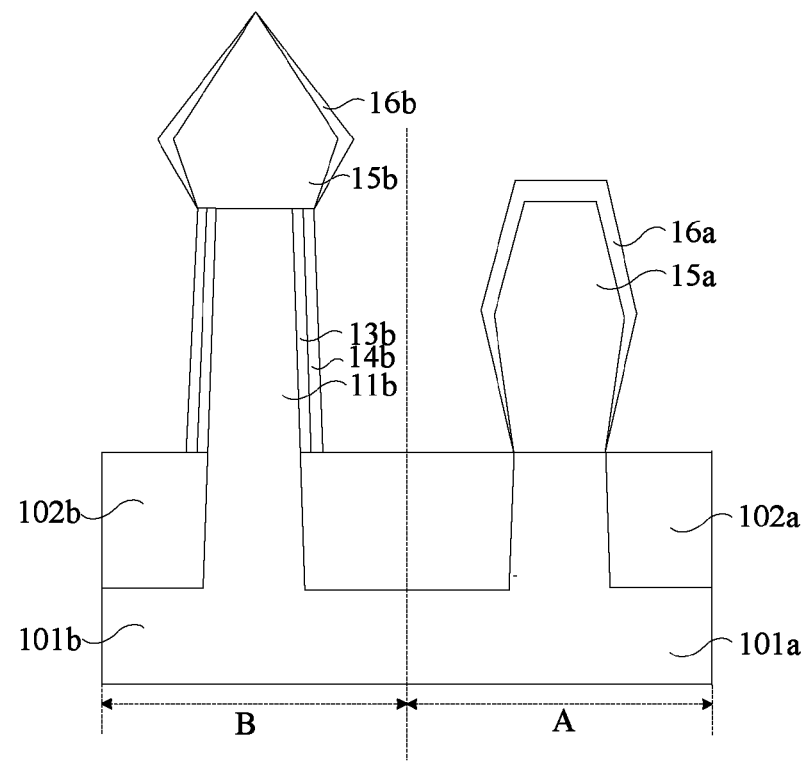
Figure 7:
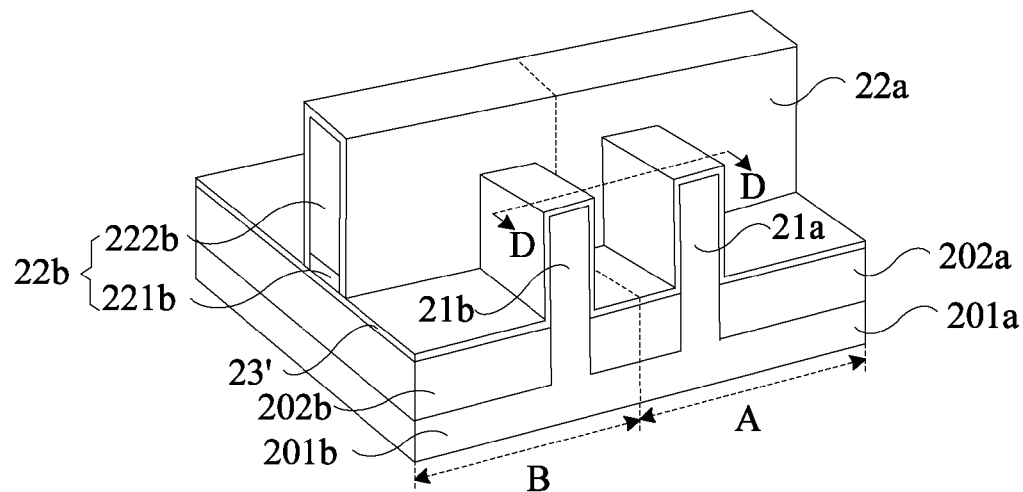
FIGS. 7~20 illustrate semiconductor structures corresponding to certain stages of an exemplary fabrication process of a semiconductor structure having a plurality of FinFETs consistent with the disclosed embodiments.

As shown in FIG. 21, at the beginning of fabrication process, a substrate with certain structures is provided (S101). FIG. 7 illustrates a corresponding semiconductor structure; and FIG. 8 illustrates a cross-sectional view of the structure illustrated in FIG. 7 along the DD direction.

Figure 8:
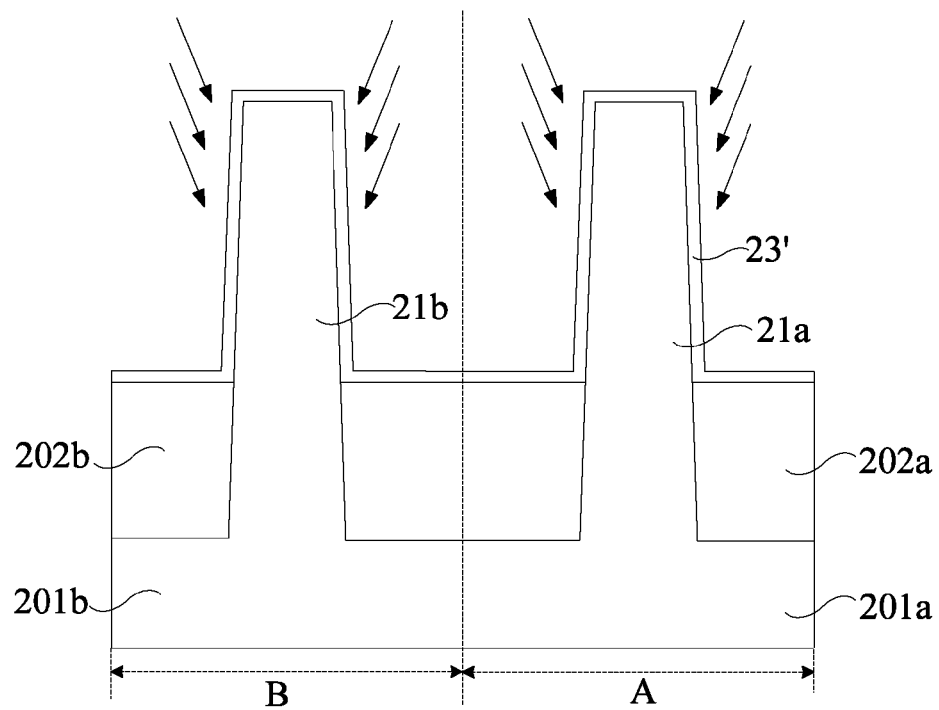

As shown in FIGS. 7~8, a semiconductor substrate (not labeled) is provided. The semiconductor substrate may having a first region and a second region. In one embodiment, the first region is a PMOS region "A"; and the second region is an NMOS region "B". A first fin 21a may be formed on the semiconductor substrate in the PMOS region "A"; and a second fin 21b may be formed on the semiconductor substrate in the NMOS region "B". The first fin 21a in the PMOS region "A" may be used to subsequently form a P-type FinFET; and the second fin 21b may be used to subsequently form an N-type FinFET.

Specifically, the semiconductor substrate in the PMOS region "A" may include a first semiconductor substrate 201a having at least two protruding structures; and a first insulation layer 202a formed on the first semiconductor substrate 201a between the protruding structures. The top surface of the first insulation layer 202a may be lower than the top surfaces of the protruding structures. The portions of the protruding structures higher than the top surface of the first insulation layer 202a may be configured as first fins. For illustrative purposes, one first fin 21a is shown in FIGS. 7~8.

The semiconductor substrate in the NMOS region "B" may include a second semiconductor substrate 201b having at least two protruding structures; and a second insulation layer 202b may be formed on the second semiconductor substrate 201b between the protruding structures. The top surface of the second insulation layer 202b may be lower than the top surfaces of the protruding structures. The portion of the protruding structures higher than the top surface of the second insulation layer 202b may be configured second fins. For illustrative purposes, one second fin 21b is shown in FIGS. 7~8.

Further, a first gate structure 22a is formed over the first fin 21a and on the first insulation layer 202a; and a second gate structure 22b is formed over the second fin 21b and on the second insulation layer 202b. The first gate structure 22a may include a first gate dielectric layer (not shown) covering top and side surfaces of the first fin 21a and the first insulation layer 202a; and a first gate layer (not shown) formed on the first gate dielectric layer. The second gate structure 22b may include a second gate dielectric layer 221b covering side and top surfaces of the second fin 21b; and a second gate layer 222b formed on the second gate dielectric layer 221b.

The first semiconductor substrate 201a and the second semiconductor substrate 201b may be made of any appropriate semiconductor materials, such as one or more of single crystal silicon, polysilicon, silicon on insulator (SOI), silicon germanium, carborundum, indium antimonite, lead telluride, indium arsenide, indium phosphate, gallium arsenide, gallium antimonite, alloy semiconductor or a combination thereof. In one embodiment, the first semiconductor substrate 201a and the second semiconductor substrate 201b are made of single crystal silicon. The first semiconductor substrate 201a and the second semiconductor substrate 201b provide bases for subsequent devices and processes.

In one embodiment, the first semiconductor substrate 201a and the second semiconductor substrate 201b may be made of a same material, and the first semiconductor substrate 201a and the second semiconductor substrate 201b may be a same substrate. In certain other embodiments, the first semiconductor substrate 201a and the second semiconductor substrate 201b may be made of different semiconductor materials, and the first semiconductor substrate 201a and the second semiconductor substrate 201b may be two separated substrates.

In one embodiment, the first fin 21a and/or the second fin 21b may be formed by etching a semiconductor substrate with a predetermined depth. Thus, the first fin 21a and/or the second fin 21b may be formed on the first semiconductor substrate 201a and/or the second semiconductor substrate 201b, respectively.

In certain other embodiments, the first fin 21a and/or the second fin 21b may be formed by depositing semiconductor structures on the first semiconductor substrate 201a and the second semiconductor substrate 201b. The semiconductor structures may be configured as the first fin 21a and the second fin 21b.

In one embodiment, the first gate structure 22a and the second gate structure 22b may be a same gate structure. In certain other embodiments, the first gate structure 22a and the second gate structure 22b may be different gate structures.

The first gate dielectric layer and the second gate dielectric layer 221b may be made of any appropriate material, such as a high-K dielectric material including one or more of $HfO_2$, $Al_2O_3$, $ZrO_2$, HfSiO, HfSiON, HfTaO, and HfZrO, etc. The first gate layer and the second gate layer 222b may be made of any appropriate material, such as poly silicon, etc.

Further, a first sidewall material layer 23' may be formed on the first substrate semiconductor substrate 201a, the top and side surfaces of the first fin 21a in the PMOS region "A" of the semiconductor substrate 201a, the second semiconductor substrate 201b, and the top and side surfaces of the second fin 21b in NMOS region "B" of the second semiconductor substrate 201b. The first sidewall material layer 23' may be a double-layer structure including a silicon oxide layer (not labeled) on the bottom and a silicon nitride layer (not labeled) on the silicon oxide layer.

Further, a low dose drain (LLD) ion implantation process and a Halo ion implantation process may be performed on the first fin 21a and the second fin 21b at both sides of the first gate structure 22a and the second gate structure 22b. After the ion implantation processes, a thermal annealing process may be performed. Thus, LDD ion implanting regions (not shown) and Halo ion implanting regions (not shown) may be formed in the first fin 21a and the second fin 21b at both sides of the first gate structure 22a and the second gate structure 22b.

Figure 9:
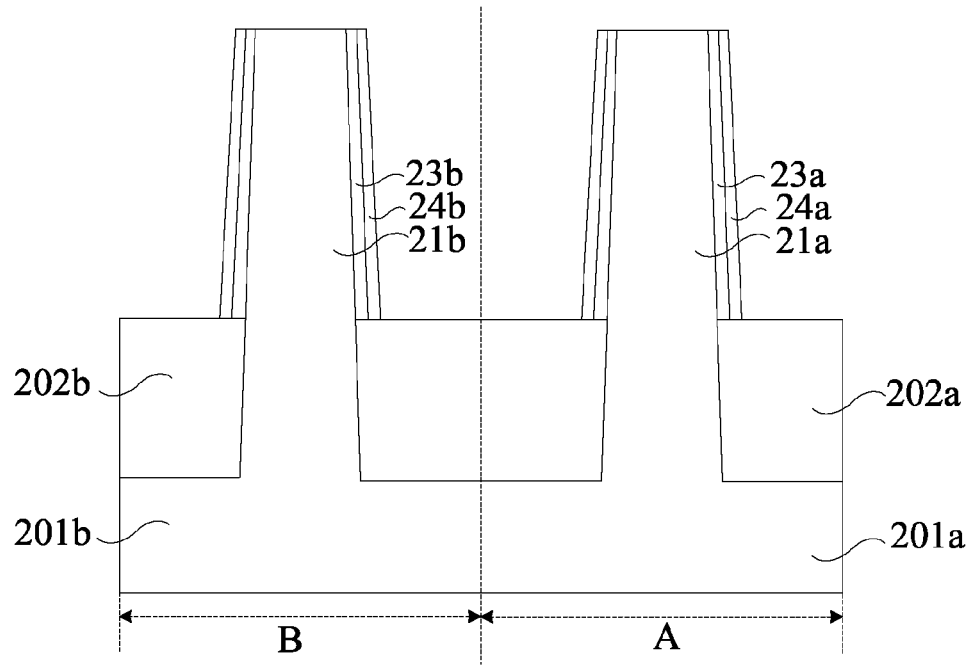

Returning to FIG. 21, after forming the LDD ion implanting regions and the Halo ion implanting regions, a first fin sidewall spacer and a second fin sidewall spacer may be formed (S102). FIG. 9 illustrates a corresponding semiconductor structure.

As shown in FIG. 9, a first fin sidewall spacer (not labeled) is formed around the first fin 21a; and a second fin sidewall spacer (not labeled) is formed around the second fin 21b. Before forming the first fin sidewall spacers and the second fin sidewall spacer, a second sidewall material layer (not shown) may be formed on the first sidewall material layer 23'. The second sidewall material layer may be made of silicon nitride, etc.

The first fin sidewall spacer and the second fin sidewall spacer may be formed by performing an etch-back process on the first sidewall material layer 23' and the second sidewall material layer. Thus, referring to FIG. 9, the first fin sidewall spacer may include a first oxide sidewall spacer 23a and a first nitride sidewall spacer 24a. The first nitride sidewall spacer 24a may include the silicon nitride layer of the first sidewall spacer material layer 23' and the second sidewall spacer material layer.

The second fin sidewall spacer may include a second oxide sidewall spacer 23b and a second nitride sidewall spacer 24b. The second nitride sidewall spacer 24b may include the nitride layer of the first sidewall spacer material layer 23' and the second sidewall spacer material layer.

Figure 10:
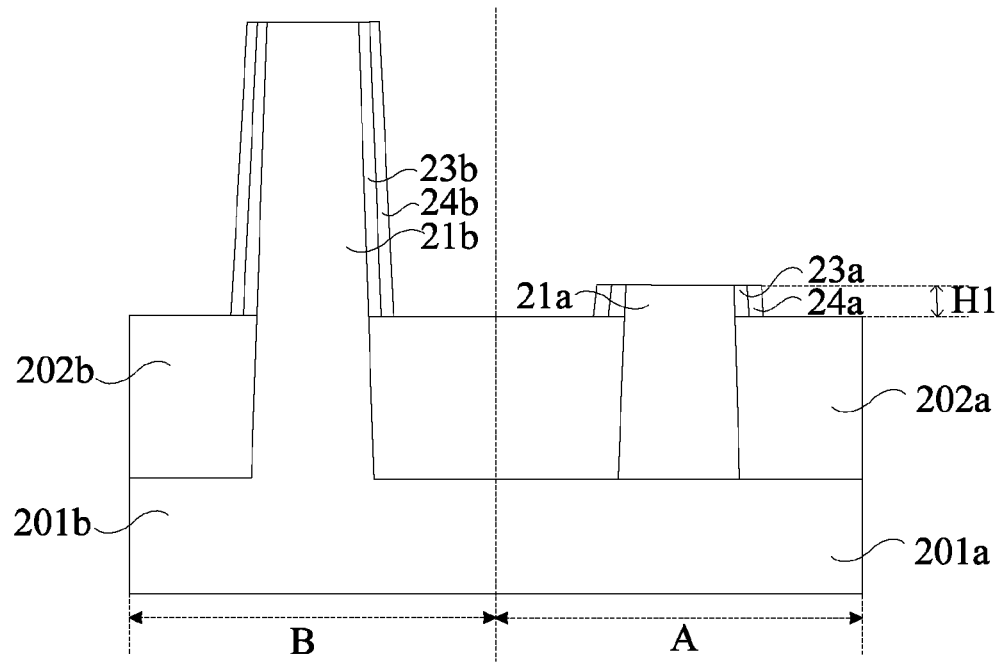

Returning to FIG. 21, after forming the first fin sidewall spacer and the second fin sidewall spacer, a portion of the first fin 21a and a portion of the first fin sidewall spacer may be removed (S103). FIG. 10 illustrates a corresponding semiconductor structure.

As shown in FIG. 10, also referring to FIG. 7, a top portion of the first fin 21a and a top portion of the first fin sidewall spacer are removed. A process for removing the top portion of the first fin 21a and the top portion of the first fin sidewall spacer may include forming a first patterned mask layer (not shown) covering the NMOS region "B" and exposing the PMOS region "A" over the first substrate 201a and the second substrate 201b; and followed by removing the top portion of the first fin 21a and the top portion of the first fin sidewall spacer with a predetermined size.

The height of the remaining portion of the first fin 21a and the first fin sidewall spacer may be referred as a first predetermined height "H1". In one embodiment, the original height of the first fin 21a and the first sidewall spacer may be referred as "H". The first predetermined height "H1" may be greater than ⅓ H, and smaller than ⅔ H.

The first patterned mask layer may be made of any appropriate material. In one embodiment, the first patterned mask layer is a patterned photoresist layer.

In one embodiment, the top portion of the first nitride sidewall spacer 24a may be removed from top to bottom with a first height "h" (not shown) firstly. A sum of the first height "h" and the first predetermined height "H1" may be smaller than the original height "H" of the first fin 21a. Then, the top portion of the exposed first oxide sidewall spacer 23a may be removed from top to bottom with the first height "h". Then, the top portion of the first fin 21 may be removed from top to bottom with the first height "h". The cycle of removing the top portion of the first nitride sidewall spacer 24a with the first height "h", removing the top portion of the first oxide sidewall spacer 23a with the first height "h" and removing the top portion of the first fin 21a with the first height "h" may be repeated until the height of the first fin sidewall spacer and the first fin 21a is reduced to the first predetermined height "H1".

Such a method for removing the top portion of the first fin sidewall spacer and the top portion of the first fin 21a to reduce the first fin sidewall spacer and the first fin 21a may cause the top surfaces of the remaining first fin sidewall spacer and the first fin 21a to be flat and smooth. When a first stress layer is subsequently formed on such a flat and smooth surface, the shape of the first stress layer may be as desired; and the first stress layer may be able to better apply a compressive stress to the subsequently formed P-type FinFET. Accordingly, the carrier mobility of the P-type FinFET may be increased; and the performance of the P-type FinFET may be enhanced.

Further, when the first stress layer is subsequently formed on such a flat and smooth surface, the connecting growth phenomena, i.e., adjacent first stress layers connect together, of the first stress layers on adjacent first fins may be prevented. Thus, short-circuit between subsequently formed first source metal vias, or the short-circuit between subsequently formed first drain metal vias may be avoided.

The top portion of the first fin sidewall spacer and the top portion of the first fin 21a may be removed by any appropriate process, such as a dry etching process, a wet etching process, or an ion beam etching process, etc. In one embodiment, the top portion of the first fin sidewall spacer and the top portion of the first fin 21a are removed by a dry etching processes.

Referring to FIG. 10, the remaining first fin sidewall spacer around the remaining first fin 21a may prevent the first stress layer subsequently formed on the remaining first fin 21a from growing excessively. If the size of the subsequently formed first stress layer is significantly large, the first stress layer may be unable to effectively apply a compressive stress to the channel region of the FinFET. Further, if the first gate structure is a polysilicon gate structure, the first stress layer with a significantly large size may have a large possibility to be higher than the first gate structure 22a. When a chemical mechanical polishing (CMP) process is subsequently performed to form a first metal gate structure, the CMP process may stop on the first stress layer, not stop on the first metal gate. Thus, the thickness of the metal gate structure may be increased; and the performance of the subsequently formed P-type FinFET may be adversely affected. Further, if first stress layers with the significantly large size are formed on adjacent remaining first fins 21a, the first stress layers may be connected (connection growth). Thus, short-circuit between the subsequently formed first source metal vias, and/or the short-circuit between the subsequently formed second metal vias may occur.

Further, in one embodiment, the height of the remaining first fin 21a may be equal to the height the remaining first fin sidewall spacer. If the height of the remaining first fin 21a is greater than the height of the remaining first fin sidewall spacer, the forming rate of the subsequently formed first stress layer may be relatively large, the compactness of the first stress layer may not match the desired requirements; and the performance of the first stress layer may not match the desired requirements neither. Accordingly, the compressive stress applied on the channel region may be relatively small. If the height of the remaining first fin 21a is smaller than the height of the remaining first sidewall spacer, it may be difficult for the first stress layer to grow on the portion of the first fin 21a connecting with the first fin sidewall spacer; and the growth rate of the first stress layer may be substantially low.

Further, the first predetermined height "H1" may be optimized to cause the subsequently formed first stress layer and the channel region of the subsequently formed P-type FinFET to have an optimized distance. The optimized distance may ensure the first stress layer to apply a most effective stress to the channel region of the subsequently formed P-type FinFET. Further, it may also be able to optimize the efficiency for forming the first stress layer.

In certain other embodiments, a sum of the first height "h" and the first predetermined height "H1" may be equal to the original height "H". Thus, it may not need to repeat the cycle of removing the top portion of the first nitride sidewall spacer 24a with the first height "h", removing the top portion of the first oxide sidewall spacer 23a with the first height "h" and removing the top portion of the first fin 21a with the first height "h"; and it may only need one cycle to reduce the height of the first fin 21a and the first fin sidewall spacer to be the first predetermined height "H1".

In certain other embodiments, the first predetermined height "H1" may be equal to zero. That is, the top surface of the remaining protruding structure may level with the top surface of the first insulation layer 202. A silicon germanium layer may be subsequently formed on the top surface of the remaining protruding structure.

Figure 11:
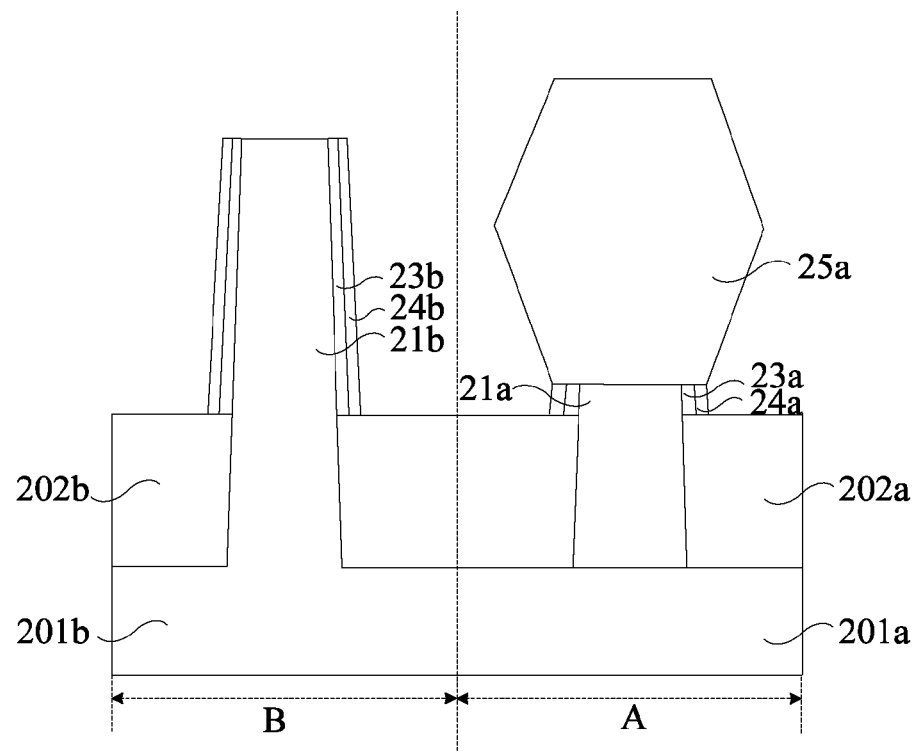

Returning to FIG. 21, after removing the top portion of the first fin 21a and the top portion if the first fin sidewall spacer, a first stress layer may be formed (S104). FIG. 11 illustrates a corresponding semiconductor structure.

As shown in FIG. 11, a first stress layer 25a is formed on the surface of the remaining first fin 21a. The first stress layer 25a may be made of any appropriate material. In one embodiment, the first stress layer 25a is made of silicon germanium.

Further, the first stress layer 25a may be doped with first source and drain doping ions. The first source and drain doping ions may be any appropriate ions. In one embodiment, the first source and drain doping ions are boron ions.

The first stress layer 25a may be formed by any appropriate process, such as a CVD process, an FCVD process, or an epitaxial growth process, etc. In one embodiment, the first stress layer 25a with the first source and drain doping ions is formed by an in-situ doping growth process. Specifically, the first stress layer 25a is formed by an epitaxial growth process, a doping process is performed simultaneously. Comparing with an ion implantation process, the in-situ doping growth process may be easily controlled; and may be able to achieve a gradient doping.

Referring to FIG. 11, the first stress layer 25a formed by the in-situ doping growth process may have a certain regular shape, such as a hexagonal shape, etc. The first stress layer 25a may be other shapes depending on the material of the first stress layer 25a.

Figure 12:
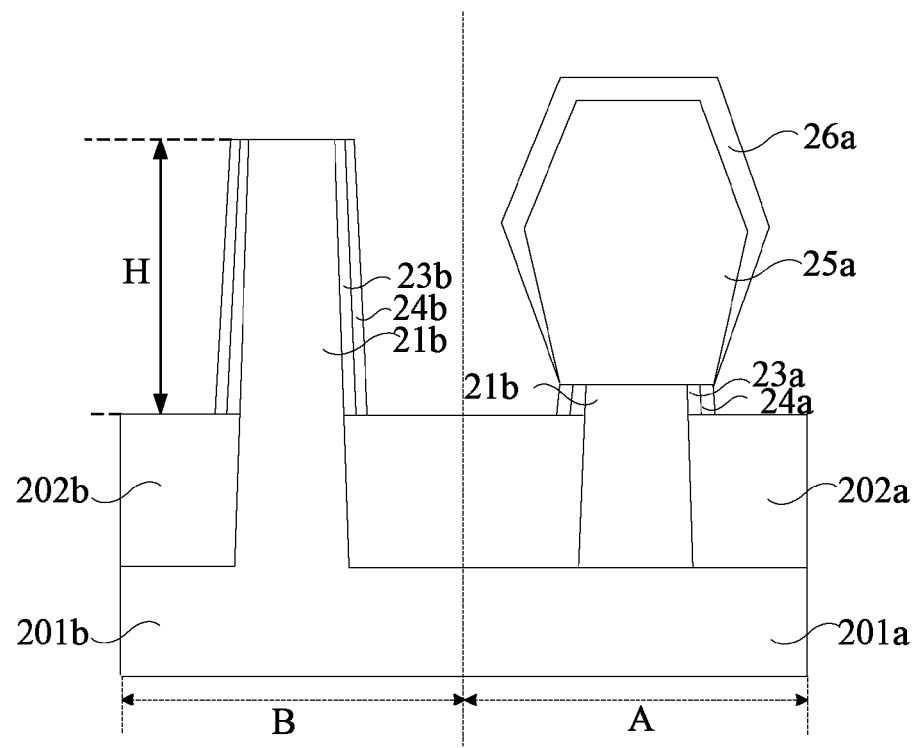

Returning to FIG. 21, after forming the first stress layer 25a, a first cover layer may be formed (S105). FIG. 12 illustrates a corresponding semiconductor structure.

As shown in FIG. 12, a first cover layer 26a is formed on the first stress layer 25a. The first cover layer 26a may be made of any appropriate material. In one embodiment, the first cover layer 26a is made of silicon.

Various processes may be used to form the first stress layer 26a, such as a CVD process, an FCVD process, or an epitaxial growth process, etc. In one embodiment, the first stress layer 26a is formed by an epitaxial growth process.

After forming the first stress layer 26a, the first patterned mask layer may be removed. The first patterned mask layer may be removed by any appropriate process, such as a dry etching process, a wet etching process, or a plasma ashing process, etc.

Figure 13:
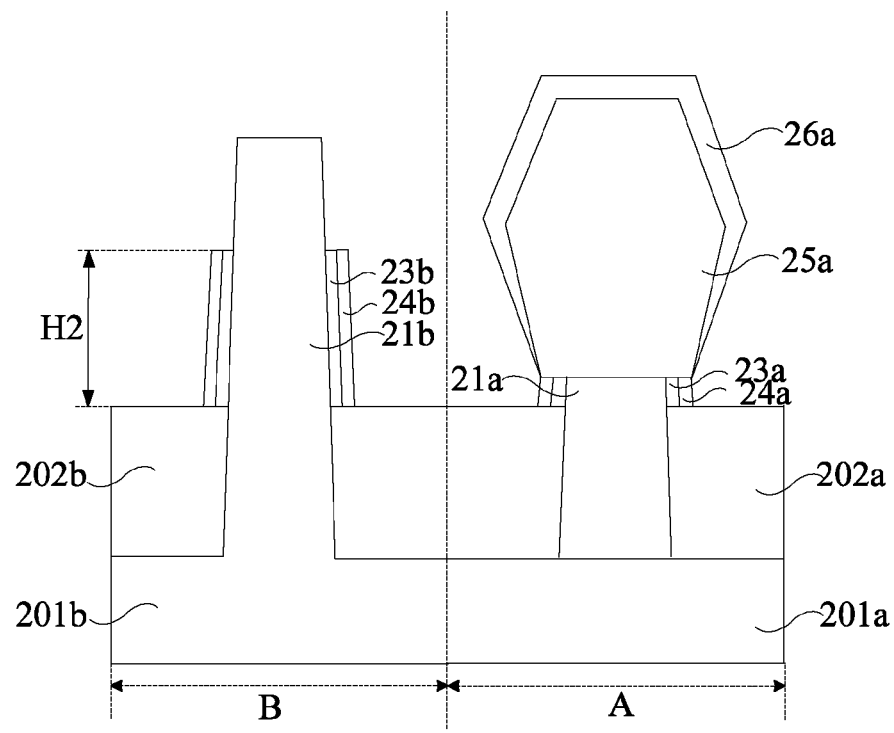

Returning to FIG. 21, after forming the first stress layer 26a, a top portion of the second fin sidewall spacer may be removed (S106). FIG. 13 illustrates a corresponding semiconductor structure.

As shown in Figure, a top portion of the second fin sidewall spacer is removed; and the remaining second sidewall spacer may have a second predetermined height "H2". That is, the remaining second nitride sidewall spacer 23b and the remaining second oxide sidewall spacer 24b may have the second predetermined second height "H2"; and the top portion of the second fin 21b may be exposed.

A process for removing the top portion of the second fin sidewall spacer may include forming a second patterned mask layer (not shown) covering the PMOS regions "A" and exposing the NMOS region "B" over the first semiconductor substrate 201a and the second semiconductor substrate 201b; removing the top portion of the second nitride sidewall spacer 24b to reduce the second nitride sidewall spacer 24b to be the second predetermined height "H2"; and removing the top portion of the second oxide sidewall spacer 23b to reduce the second silicon oxide sidewall spacer to the top surface of the remaining second nitride sidewall spacer 24b. Thus, the top portion of the second fin sidewall spacer may be removed; the remaining second fin sidewall spacer may have the second predetermined height "H2"; and the top portion of the second fin 21b may be exposed.

The second patterned mask layer may be made of any appropriate material. In one embodiment, the second patterned mask layer is a patterned photoresist layer.

The second nitride sidewall spacer 24b may be removed by any appropriate process, such as a dry etching process, or a wet etching process, etc. In one embodiment, the second nitride sidewall spacer 24b is removed by a dry etching process. The etching gas of the dry etching process may include any appropriate gas. In one embodiment, the etching gas is $CHF_3$; and the diluting gas is Ar. The flow rate of $CHF_3$ may be in a range of approximately 1 sccm~200 sccm. The flow rate of Ar may be in a range of approximately 10 sccm~500 sccm. The pressure of the etching chamber may be in a range of approximately 10 mTorr~200 mTorr. The frequency of the plasma of the dry etching process may be in a range of approximately 0.1 Hz~1000 Hz. The source power of the plasma may be in a range of approximately 50 W~500 W. The bias power of the plasma may be in a range of 0 W~200 W. The duty cycle may be in a range of approximately 10%~90%.

The second oxide sidewall spacer 23b may be removed by any appropriate process, such as a dry etching process, or a wet etching process, etc. In one embodiment, the second oxide sidewall spacer 23b is removed by a dry etching process. The etching gas of the dry etching process may include any appropriate gas. In one embodiment, the etching gas is $C_4H_8$; and the diluting gas is Ar. The flow rate of $C_4H_8$ may be in a range of approximately 5 sccm~200 sccm. The flow rate of Ar may be in a range of approximately 10 sccm~500 sccm. The pressure of the etching chamber may be in a range of approximately 10 mTorr~200 mTorr. The frequency of the plasma of the dry etching process may be in a range of approximately 0.1 Hz~1000 Hz. The source power of the plasma may be in a range of approximately 50 W~500 W. The bias power of the plasma may be in a range of 0 W~200 W. The duty cycle may be in a range of approximately 10%~90%.

After the etching processes, the top portion of the second fin 21b may be exposed; and the top surface of the second fin 21b may be concave-shaped. The concave surface of the top surface of the second fin 21b may be a portion of a circular surface. Thus, the concave surface of the top surface of the second fin 21b may be uniform and smooth. For example, the top surface of the second fin 21b may be a regular bowl-shaped surface. The inner surface of the ball-shaped surface may be uniform and smooth. The etching process may need to be optimized to obtain the concave-shaped top surface of the second fin 21b.

Figure 14:
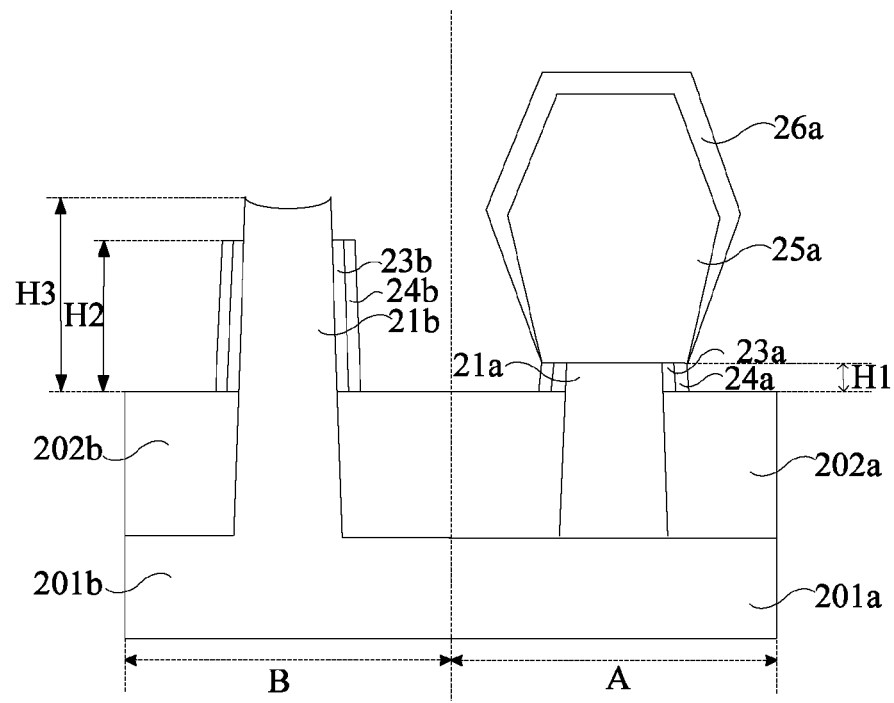

Returning to FIG. 21, after removing the top portion of the second fin sidewall spacer, the top portion of the second fin 21b may be removed (S107). FIG. 14 illustrates a corresponding semiconductor structure.

As shown in FIG. 14, the top portion of the second fin 21b is removed; and the height of the second fin 21b may be reduced to a third predetermined height "H3". The original height of the second fin 21b may be referred as "H".

Referring to FIG. 8, when the LDD ion implantation process and the Halo ion implantation process are performed on the second fin 21b, the crystal lattice of the top of the second fin 21b may be severely damaged. The subsequent thermal annealing process may be unable to repair the crystal damages on the top of the second fin 21b.

For the planar transistors, the surface damages caused by the LDD ion implantation process and the Halo ion implantation process may be repaired by a corresponding thermal annealing process because the single silicon substrate may grow to the damaged portions during the thermal annealing process. However, for FinFETs, the critical dimension of the fins (second fin 21b) may be substantially small, it may be difficult for the single crystal silicon to grow from the bottom of the protruding structure to the top of the second fin 21b to repair the damages on the top surface. Thus, after being damaged by the LDD ion implantation process and the Halo ion implantation process, the top surface of the second fin 21b may not be repaired by the subsequently thermal annealing process. Therefore, twin defects may be formed in the top surface of the second fin 21b. The twin defects may adversely affect the performance of the subsequently formed N-type FinFET. Therefore, the top portion of the second fin 21b may be removed to remove the damages, such as the twin defects, etc.; and the performance of the subsequently formed N-type FinFET may be improved.

Further, referring to FIG. 14, the third predetermined height "H3" of the remaining second fin 21b may be greater than ⅔ H, and may be smaller than ⅚ H. That is, the height of the removed portion of the second fin 21b may be greater than ⅙ H, and smaller than ⅓ H. If the second fin 21b is remove too much, the size of the channel region of the subsequently formed N-type FinFET may be affected; and the performance of the subsequently formed N-type FinFET may be affected as well. If the second fin 21b is removed too less, the damages on the top of the second fin 21b may be not be removed enough; and the performance of the subsequently N-type FinFET may also be adversely affected.

The top surface of the remaining second fin 21b may also be concave-shaped; and the concave surface of the remaining second fin 21 may be a regular arc surface of a portion of a circle. The inner arc surface of the top of the second fin 21 may be uniform and smooth. A second stress layer may be subsequently formed on the uniform and smooth top concave surface of the second fin 21b. The second stress layer may be able to sufficiently apply a tensile stress to the subsequently formed N-type FinFET. Thus, the carrier mobility of the subsequently formed N-type FinFET may be increased; and the performance of the N-type FinFET may be enhanced.

Further, the second stress layer subsequently formed on the uniform and smooth concave top surface of the second fin may have a certain regular shape. Thus, the second stress layers subsequently formed on adjacent second fins 21b may not connect. Accordingly, short-circuit between the subsequently formed second source metal contacts, or the short-circuit between the subsequently formed second drain metal contacts may be avoided.

Further, referring to FIG. 14, the second predetermined height "H2" of the second fin sidewall spacer may be smaller than the third predetermined height "H3" of the remaining second fin 21b. A second stress layer may be subsequently formed on the top surface of the remaining second fin 21b by an-in situ doping growth process, or an epitaxial growth process. The subsequently formed FinFET may be an N-type FinFET. Thus, the second stress layer may be made of silicon carbide. The growth rate of silicon carbide on the remaining second fin 21b may be substantially small. When the second predetermined height "H2' is smaller than the third predetermined "H3", the top surface of the remaining second fin 21b may be entirely exposed. Thus, it may be easy to increase the growth rate of the second stress layer on the remaining second fin 21b. Further, such a structure may also increase the volume of the second stress layer to enhance the performance of the subsequently formed N-type FinFET.

Further, the second predetermined height "H2" of the second fin sidewall spacer may be optimized to be greater than the first predetermined height "H1" of the remaining first fin 21a; and smaller than the third predetermined height "H3" of the remaining second fin 21b. If the second predetermined height "H2' is substantially small, the volume of the subsequently formed second stress layer may be significantly large; and it may be easy to cause the second stress layers subsequently formed on adjacent second fins 21b to interconnect. If the second fin sidewall spacer is removed too less, the growth rate of the subsequently formed second stress layer may be substantially small. Thus, the performance of the subsequently formed N-type transistor may be adversely affected. Further, with such a relationship of the first predetermined height "H1", the second predetermined height "H2" and the third predetermined height "H3", the second stress layer may effectively apply a tensile stress layer to the channel region of the subsequently formed N-type FinFET; and the time for growing the second stress layer may be the shortest.

In certain other embodiments, the height of the remaining second fin sidewall spacer may be equal to the height of the remaining second fin.

Figure 15:
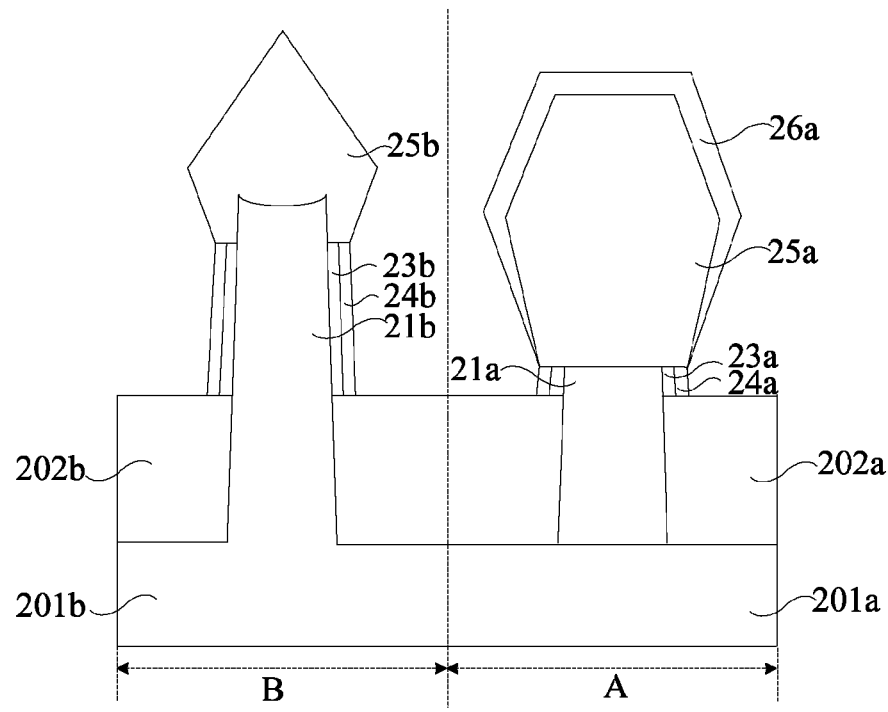

Returning to FIG. 21, after removing the top portion of the second fin 21b, a second stress layer may be formed (S108). FIG. 15 illustrates a corresponding semiconductor structure.

As shown in FIG. 21, a second stress layer 25b is formed on the surface of the remaining second fin 21b. The second stress layer 25b may be made of any appropriate material. In one embodiment, the second stress layer 25b is made of silicon carbide.

The second stress layer 25b may be doped with second source and drain doping ions. The second source and drain doping ions may be any appropriate ions. In one embodiment, the second source and drain doping ions are phosphorous ions.

The second stress layer 25b may be formed by any appropriate processes, such as a CVD process, an FCVD process, or an epitaxial growth process, etc. In one embodiment, the second stress layer 25b is formed by an in-situ doping growth process. The in-situ doping growth process may be easily controlled; and may be able to obtain a gradient doping.

Figure 16:
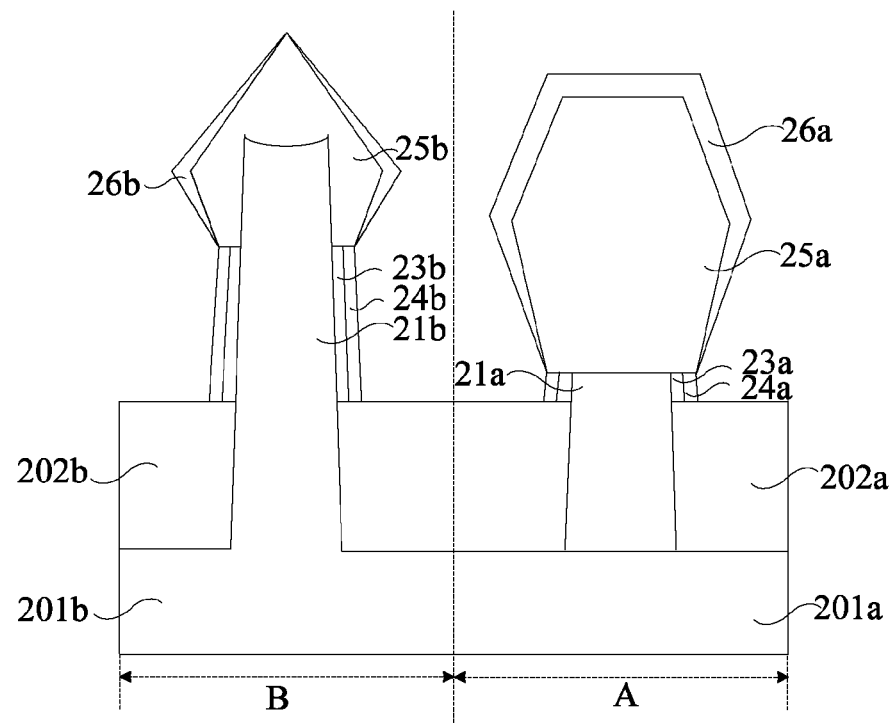

Returning to FIG. 21, after forming the second stress layer 25b, a second cover layer may be formed (S109). FIG. 16 illustrates a corresponding semiconductor structure.

As shown in FIG. 16, a second cover layer 26b is formed on the second stress layer 25b. The second cover layer 26b may be made of any appropriate material. In one embodiment, the second cover layer 26b is made of silicon.

Various processes may be used to form the second cover layer 26b. In one embodiment, the second cover layer 26b is formed by an epitaxial growth process.

After forming the second cover layer 26b, the second patterned mask layer may be removed. Various processes may be used to remove the second patterned mask layer, such as a dry etching process, a wet etching process, or a plasma ashing process, etc.

As described above, in one embodiment, the first stress layer 25a and the first cover layer 26b may be formed firstly; and then the second stress layer 25b and the second stress layer 26b may be formed. The first stress layer 25a may be made of silicon germanium; and the second stress layer 25b may made of silicon carbide. The temperature for forming the second stress layer 25b may be substantially lower than the temperature for forming the first stress layer 25a. If the second stress layer 25b is formed firstly, the high temperature process for forming the first stress layer 25a may adversely affect the performance of the formed semiconductor structure. For example, it may affect the size the ion implantation regions, etc.

Further, if the second stress layer 25b is formed first, during the process for forming the first stress layer 25a, the precursors in the reaction gas may release a large quantity of hydrogen. The large quantity of hydrogen may affect the quality of the second stress layer 25b. Thus, the performance of the subsequently formed FinFET may be affected.

In certain other embodiments, the second stress layer 25a and the second cover layer 26b may be formed first. Then, the first stress layer 25a and the first cover layer 26a may be formed.

Figure 17:
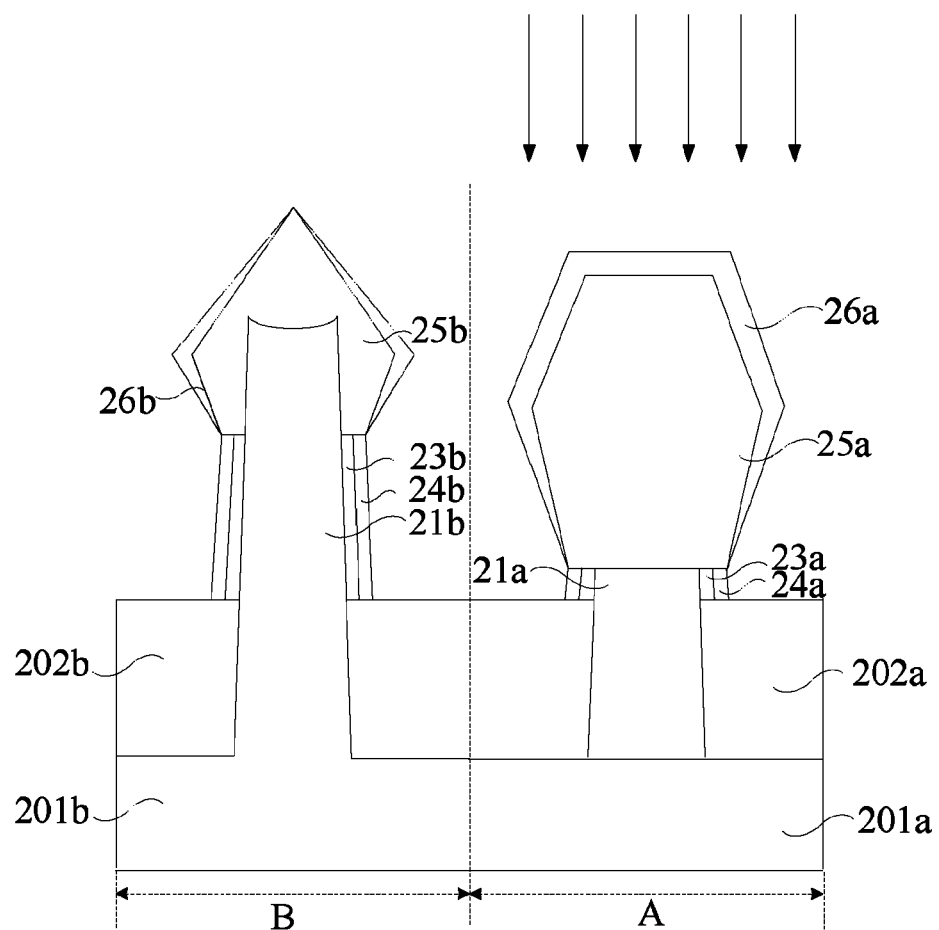

Returning to FIG. 21, after forming the second cover layer 26b, a first source and drain ion implantation process may be performed (S110). FIG. 17 illustrates a corresponding semiconductor structure.

As shown in FIG. 17, a first source and drain ion implantation process (not labeled) is performed on the first stress layer 25a. A process for performing the first source and drain ion implantation process may include forming a third patterned mask layer covering the second semiconductor substrate 201b and the second stress layer 26b in the NMOS region "B"; and exposing the PMOS region "A"; and followed by performing the first source and drain ion implantation process using the third patterned mask layer as a mask.

The third patterned mask layer may be made of any appropriate material. In one embodiment, the third patterned mask layer is a patterned photoresist layer.

The ions of the first source and drain ion implantation process may be referred as first source and drain ions. The first source and drain ions may be appropriate ions. In one embodiment, the first source and drain ions are boron ions.

Performing the first source and drain ion implantation process may cause more first source and drain ions to be at the non-substituting positions of the crystal lattice of the first stress layer 25a. During the subsequent thermal annealing process, the first source and drain ions may be activated to occupy the crystal lattice of the first stress layer 25a. The contact resistance of the first stress layer 25a may be inversely proportional to the doping concentration of the first source and drain ions (P-type doping concentration). Thus, performing a first source and drain ion implantation process in the first stress layer 25a with a relatively large dosage may further reduce the contact resistance of the first stress layer 25a.

After the first source and drain ion implantation process, the third patterned mask layer may be removed. The third patterned mask layer may be removed by any appropriate process, such as a dry etching process, a wet etching process, or a plasma ashing process, etc.

Figure 18:
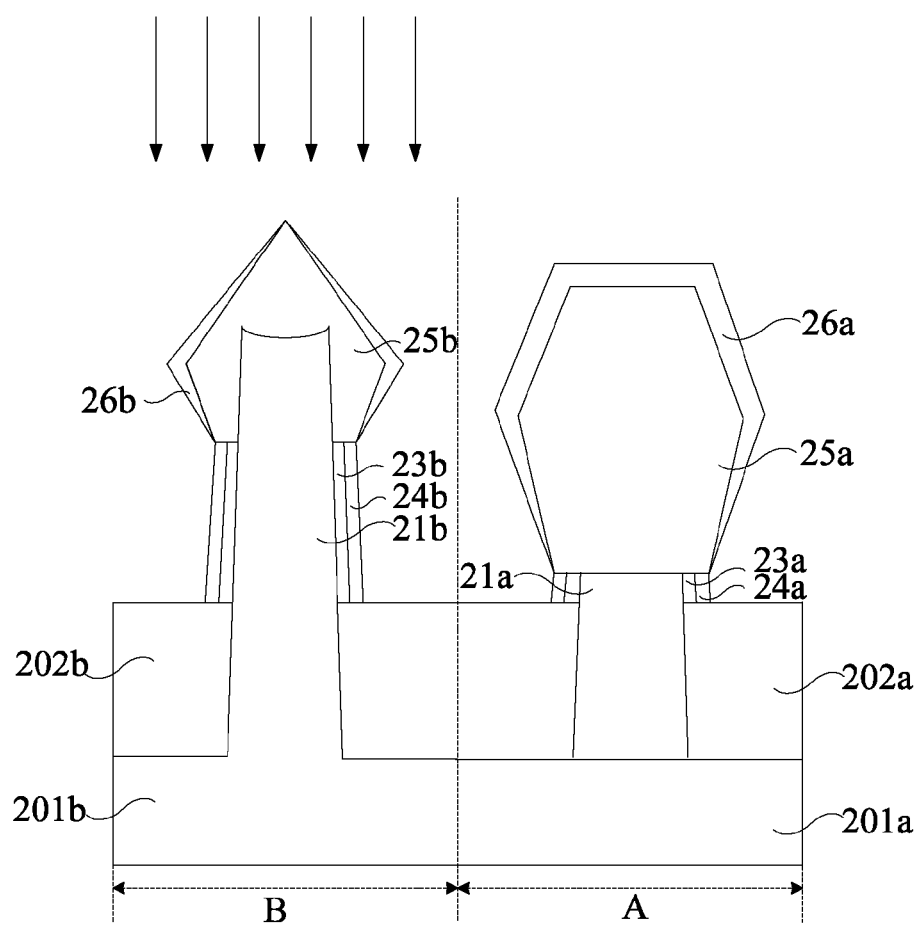

Returning to FIG. 21, after performing the first source and drain ion implantation process, a second source and drain ion implantation process may be performed (S111). FIG. 18 illustrates a corresponding semiconductor structure.

As shown in FIG. 18, a second source and drain ion implantation process (not labeled) is performed on the second stress layer 25b. A process for performing the second source and drain ion implantation process may include forming a fourth patterned mask layer covering the first semiconductor substrate 201a and the first stress layer 25a in the PMOS region "A", and exposing the NMOS region "B"; and followed by performing the second source and drain ion implantation process using the fourth patterned mask layer as a mask.

The fourth patterned mask layer may be made of any appropriate material. In one embodiment, the fourth patterned mask layer is a patterned photoresist layer.

The ions of the second source and drain ion implantation process may be referred as second source and drain ions. The second source and drain ions may be any appropriate ions. In one embodiment, the second source and drain ions are boron ions.

Performing the second source and drain ion implantation process may cause more second source and drain ions to be at the non-substituting positions of the crystal lattice of the second stress layer 25b. During the subsequent second thermal annealing process, the second source and drain ions may be activated to occupy the crystal lattice of the second stress layer 25b. The contact resistance of the second stress layer 25b may be inversely proportional to the doping concentration of the second source and drain ions (N-type doping concentration). Thus, performing the second source and drain ion implantation process in the second stress layer 25b with a relatively large dosage may further reduce the contact resistance of the second stress layer 25b.

After the second source and drain ion implantation process, the fourth patterned mask layer may be removed. The fourth patterned mask layer may be removed by any appropriate process, such as a dry etching process, a wet etching process, or a plasma ashing process, etc.

In certain other embodiments, the second source and drain ion implantation process may be performed on the second stress layer 25b firstly; and then the first source and drain ion implantation process may be performed on the first stress layer 25a.

In certain other embodiments, the first source and drain ion implantation process and or the second source and drain ion implantation process may be omitted.

Further, after the first source and drain ion implantation process and the second source and drain ion implantation process, a source and drain thermal annealing process may be performed on the first stress layer 25a and the second stress layer 25b to activate the first source and drain ions and the second source and drain ions in the first stress layer 25a and the second stress layer 25b. Thus, a first source region, a first drain region, a second source region and a second drain region may be formed.

Figure 19:
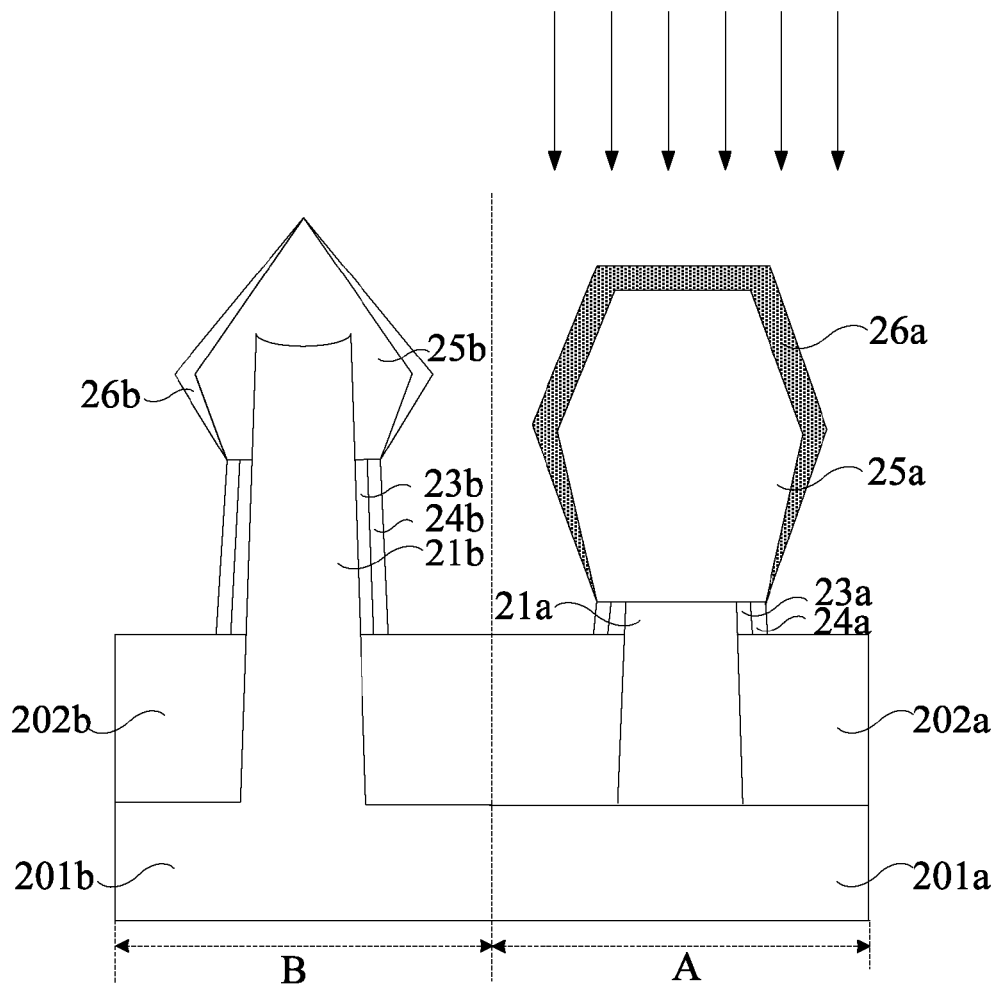

Returning to FIG. 21, after forming the first source region, the first drain region, the second source region and the second drain region, a first potential barrier reducing ion implantation process may be performed (S112). FIG. 19 illustrates a corresponding semiconductor structure.

As shown in FIG. 19, a first potential barrier reducing ion implantation process (not labeled) is performed on the first cover layer 26a. A process for performing the first potential barrier reducing ion implantation process may include forming a first patterned photoresist layer covering the NMOS region "B" and the second cover layer 26b and exposing the PMOS region "A"; and followed by performing the first potential barrier reducing ion implantation process. The first potential barrier reducing ions may include one or more of Al ions, Ga ions, B ions, $BF_2$ ions, Ge ions and In ions, etc.

When the first potential barrier reducing ions are at least one of Al ions, Ga ions, B ion, $BF_2$ ion and In ions, the doping dosage of the first potential barrier reducing ion implantation process may be equal to or greater than 1E13 atom/cm$^2$, and smaller than or equal to 1E14 atom/cm$^2$. The energy of the first potential barrier reducing ion implantation process may be equal to or greater than 5 KeV, and smaller than or equal to 30 KeV.

When the first potential barrier reducing ions are Ge ions, the doping dosage of the first potential barrier reducing ion implantation process may be equal to or greater than 1E13 atom/cm$^2$, and smaller than or equal to 1E14 atom/cm$^2$. The energy of the first potential barrier reducing ion implantation process may be equal to or greater than 5 KeV, and smaller than or equal to 30 KeV.

In one embodiment, when the first potential barrier reducing ion implantation process is being performed, boron ions may be implanted in the first cover layer 26a simultaneously. The doping dosage of the boron ions may be greater than the doping dosage of the first potential barrier reducing ions. Doping the boron ions may cause the boron ions to be at the non-substituting positions of the crystal lattice of the first cover layer 26a. During the thermal annealing process for subsequently forming a first contact layer, the boron ions may be activated to occupy the crystal lattice of the first cover layer 26a. Because the contact resistance of the first cover layer 26a may be inversely proportional to the doping dosage of the boron ions (p-type doping concentration), doping the boron ions in the first cover layer 26a and increasing the doping dosage of boron ions may reduce the contact resistance of the first cover layer 26a.

In certain other embodiments, the boron ions may not be doped in the first cover layer 26a with the first potential barrier reducing ion implantation process. Boron ions in the first stress layer 25a may diffuse into the first cover layer 26a during a subsequently thermal annealing process.

After the first potential barrier reducing ion implantation process, the first patterned photoresist layer may be removed. The first patterned photoresist layer may be removed by any appropriate process, such as a dry etching process, a wet etching process, or a plasma ashing process, etc. In one embodiment, the first patterned photoresist layer is removed by a plasma ashing process.

Returning to FIG. 21, after forming the first source region, the first drain region, the second source region and the second drain region, a second potential barrier reducing ion implantation process may be performed (S113). FIG. 20 illustrates a corresponding semiconductor structure.

As shown in FIG. 20, a second potential barrier reducing ion implantation process (not labeled) is performed on the second cover layer 26b. A process for performing the second potential barrier reducing ion implantation process may include forming a second patterned photoresist layer covering the PMOS region "A" and the first cover layer 26a and exposing the NMOS region "B"; and followed by performing the second potential barrier reducing ion implantation process. The second potential barrier reducing ions may include one or more of S ions, Se ions, As ions, Sb ions, and Ge ions, etc.

When the second potential barrier reducing ions are at least one of S ions, Se ions, As ions, Sb ions, and Ge ions, the doping dosage of the second potential barrier reducing ion implantation process may be equal to or greater than 1E13 atom/cm$^2$, and smaller than or equal to 1E14 atom/cm$^2$. The energy of the second potential barrier reducing ion implantation process may be equal to or greater than 5 KeV, and smaller than or equal to 30 KeV.

When the second potential barrier reducing ions are Ge ions, the doping dosage of the second potential barrier reducing ion implantation process may be equal to and greater than 1E13 atom/cm$^2$, and smaller than and equal to 1E14 atom/cm$^2$. The energy of the second potential barrier reducing ion implantation process may be equal to and greater than 5 KeV, and smaller than and equal to 30 KeV.

In one embodiment, when the second potential barrier reducing ion implantation process is being performed, phosphorous ions may be implanted in the second cover layer 26b simultaneously. The doping dosage of the phosphorus ions may be greater than the doping dosage of the second potential barrier reducing ions. Doping the phosphorous ions may cause the phosphorous ions to be at the non-substituting positions of the crystal lattice of the second cover layer 26b. During a thermal annealing process for subsequently forming a second contact layer, the phosphorous ions may be activated to occupy the crystal lattice of the second cover layer 26b. Because the contact resistance of the second cover layer 26b may be inversely proportional to the doping dosage of the phosphorous ions (n-type doping concentration), doping the phosphorus ions in the second cover layer 26b and increasing the doping dosage of phosphorous ions may reduce the contact resistance of the second cover layer 26b.

In certain other embodiments, the phosphorous ions may not be doped in the second cover layer 26b with the second potential barrier reducing ion implantation process. Phosphorous ions in the second stress layer 25b may diffuse into the second cover layer 26b during a subsequently thermal annealing process.

After the second potential barrier reducing ion implantation process, the second patterned photoresist layer may be removed. The second patterned photoresist layer may be removed by any appropriate process, such as a dry etching process, a wet etching process, or a plasma ashing process, etc. In one embodiment, the second patterned photoresist layer is removed by a plasma ashing process.

In certain other embodiments, a second potential barrier reducing ion implantation process may be performed on the second cover layer 26b firstly. Then, the first potential barrier reducing ion implantation process may be performed on the first cover layer 25a.

Further, a first dielectric layer (not shown) may be formed on the first semiconductor substrate 201a in the PMOS region "A", the first cover layer 26a, the second semiconductor substrate 201b in the NMOS region "B", and the second cover layer 26b. The top surface of the first dielectric layer may level with the top surfaces of the first gate structure 22a and the second gate structure 22b (S114). The first dielectric layer may be also be referred as an interlayer dielectric layer (IDL). That is, the IDL may fill the gaps between the first cover layer 26a and the second cover 26b, and other spaces, etc.; and the first gate structure 22a and the second gate 22b may be embedded in the IDL layer.

The first dielectric layer may be made of any appropriate material, such as silicon oxide, or low dielectric constant material, etc. Various processes may be used to form the first dielectric layer, such as a CVD process, or an FCVD process, etc.

Further, after forming the IDL, a chemical mechanical polishing (CMP) process may be performed on the IDL until the first gate structure 22a and the second gate structure 22b are exposed. Thus, the IDL may be planarized (S115).

Further, after planaring the IDL, the first gate layer of the first gate structure 22a and the second gate layer 222b of the second gate structure 22b may be removed. Thus, a first trench (not shown) and a second trench (not shown) may be formed in the first dielectric layer (S116). The bottom of the first trench may expose the first gate dielectric layer; and the bottom of the second trench may expose the second gate dielectric layer 221b. The first gate layer of the first gate structure 22a and the second gate layer 222b of the second gate structure 22b may be removed by any appropriate process, such as a dry etching process, or a wet etching process, etc.

Further, after forming the first trench and the second trench, a first metal gate layer may be formed in the first trench. The first metal gate layer and the first gate dielectric layer may form a first metal gate structure. A second metal gate layer may be formed in the second trench. The second metal gate layer and the second gate dielectric layer 221b may form a second metal gate structure.

The first metal gate layer and the second metal gate layer may be made of any appropriate material, such as Cu, Ag, Al, or W, etc. Various process may be used to form the first metal gate layer and the second metal gate layer, such as a sputtering process, or an electroplating process, etc. The first metal gate layer and the second metal gate layer may be formed by a same process, or separated processes. In one embodiment, the first metal gate layer and the second metal gate layer are formed by a same process.

Further, after forming the first metal gate layer and the second metal gate layer, a second dielectric layer (not shown) may be formed on the first dielectric layer, the first metal gate structure, and the second metal gate structure.

The second dielectric layer may be made of any appropriate material, such as silicon oxide, silicon nitride, or silicon oxynitride, etc. Various processes may be used to form the second dielectric layer, such as a CVD process, or an FCVD process, etc.

Further, after forming the second dielectric layer, first through-holes (not shown) and second through-holes (not shown) may be formed in the first dielectric layer and the second dielectric layer. The bottoms of the first through-holes may expose the first cover layer 26a; and the bottoms of the second through-holes may expose the second cover layer 26b.

The first through-holes and the second through-holes may be formed by etching through the first dielectric layer and the second dielectric layer. Various processes may be used to etch the first dielectric layer and the second dielectric layer, such as a dry etching process, or a wet etching process, etc.

Returning to FIG. 21, after forming the first through-holes exposing the first cover layer 26a and the second through-holes exposing the second cover layer 26b, a first metal layer (not shown) may be formed on the first cover layer 26a; and a second metal layer (not shown) may be formed on the second cover layer 26b (S117). In one embodiment, the first metal layer and the second metal layer may be formed by a same process.

The first metal layer and the second metal layer may be made of any appropriate material, such as Co, Mo, Pt, Ta, Ti, or W, etc. In one embodiment, the first metal layer and the second metal layer are made of Ni. The first metal layer and the second metal layer may be formed by any appropriate process, such as a CVD process, or a PVD process, etc.

Ni may react with the first cover layer 26a and the second cover layer 26b made of Si to form Ni silicide during subsequent thermal annealing processes. The grains of the subsequently formed Ni silicide may be relatively small; and the low-resistance phase may be formed. Further, because the grains of Ni silicide may be relatively small, electrical contacts to Ni silicide may be easy to form.

Returning to FIG. 21, after forming the first metal layer and the second metal layer, a first thermal annealing process may be performed on the first metal layer; and a first contact layer (not shown) may be formed. A second thermal annealing process may be performed on the second metal layer; and a second contact layer may be formed (S118).

In one embodiment, the first thermal annealing process and the second thermal annealing process may be a same thermal annealing process, and may be performed simultaneously. In certain other embodiments, the first thermal annealing process and the second thermal annealing process may be different thermal annealing processes.

In one embodiment, the first contact layer and the second contact layer are metal silicide. Specifically, the first contact layer and the second contact layer are Ni silicide ($NiSi_2$). The first thermal annealing process and the second thermal annealing process may be a rapid thermal annealing (RTA) process. The temperature of the RTA process may be in a range of approximately 150° C.~900° C.

During the first thermal annealing process, the first metal layer and the first cover layer 26a may be fused together; and the metal silicide may be formed. That is, the first contact layer may be formed. The first contact layer may be able to reduce the contact resistance between the first source region and the subsequently formed first source metal via, and the contact resistance between the first drain region and the subsequently formed first drain metal via.

In one embodiment, the thickness of the first cover layer 26a may be greater than the first contact layer. Because the first cover layer 26a may be doped with boron ions, the resistance of the first cover layer 26a may be substantially small. Thus, the contact resistance between the first source metal via and the first source region and the contact resistance between the first drain metal via and the first drain region may not be affected.

During the first thermal annealing process for forming the first contact layer, the first potential barrier reducing ions may have a relatively small solid solubility in the first contact layer; and a relative large solid solubility in the first cover layer 26a. Thus, during the first thermal annealing process, a large quantity of first potential barrier reducing ions may segregate on the bottom interface of the first contact layer. That is, the first potential barrier reducing ions may segregate at the interface between the first contact layer and the first cover layer 26a. Thus, a first dipole layer may be formed in the interface layer between the first contact layer and the first cover layer 26a. The first dipole layer may generate an electric field having a direction same as the motion direction of electrons. Thus, the height and the width of the potential barrier for carriers in the first cover layer 26a to transit to the metal layer may be reduced; and the carriers may directly transit to metal. That is, the Schottky barrier width and the height ($\Phi Bn$) may be reduced. Accordingly, the parasitic resistance ($\rho c$) of the first source region and the first drain region of the subsequently formed P-type FinFET may be reduced; and the performance of the P-type FinFET may be enhanced.

When the first potential barrier reducing ions doped into the first cover layer 26a are one or more of Al ions, Ga ions, B ions, $BF_2$ ions and indium ions, the doping dosage of the first potential barrier reducing ions may be equal to or greater than approximately 1E13 atom/$cm^2$, and smaller than or equal to approximately 1E14 atom/$cm^2$. The doping energy of the first potential barrier reducing ion implantation process may be equal to or greater than approximately 5 KeV, and smaller than or equal to approximately 30 KeV. The energy of the first potential barrier reducing ion implantation process may be the total energy of the one or more doping ions. If the doping dosage and/or the doping energy of the first potential barrier reducing ion implantation process is significantly large, excessive crystal defects may be generated in the first cover layer 26a. If the doping dosage and/or the doping energy of the first potential barrier reducing ion implantation process is substantially small, the reduction of the parasitic resistance on the first source region and the first drain region of the subsequently formed P-type transistor may be not enough.

If the first potential barrier reducing ions are Ge ions, it may be difficult to form the metal silicide layer during the first thermal annealing process. Thus, the doping dosage of the Ge ions in the first cover layer 26a may be relatively low. In one embodiment, the doping dosage of the first potential barrier reducing ions (Ge ions) may be equal to or greater than approximately 1E13 atom/$cm^2$, and smaller than or equal to approximately 1E14 atom/$cm^2$. If the doping dosage and/or the doping energy of the first potential barrier reducing ion implantation process is significantly large, excessive crystal defects may be generated in the first cover layer 26a; and it may also affect the subsequent formation of metal silicide. If the doping dosage and/or the doping energy of the first potential barrier reducing ion implantation process is substantially small, the reduction of the parasitic resistances on the first source region and the first drain region of the subsequently formed P-type FinFET may be not enough.

If the potential barrier reducing ions are a mixture of Ge ions and the other potential barrier reducing ions, the total doping dosage of the first potential barrier reducing ions may be equal to or greater than 1E13 atom/$cm^2$, and smaller than or equal to 1E15 atom/$cm^2$. The concentration of Ge ions in the mixture may be the minimum one.

The first potential barrier reducing ions may precipitate during the RTA process for forming the metal silicide; and the first potential barrier reducing ions may precipitate at interface between the first contact layer and the first cover layer 26a. Further, the first dipole layer may formed at the interface between the first contact layer and the first cover layer 26a. If the first potential barrier reducing ions are doped into the first stress layer 21a, the first potential barrier reducing ions may not precipitate; and the first dipole layer may not be formed.

In certain other embodiment, the thickness of the first contact layer is equal to the first cover layer 26a. Thus, during the first thermal annealing process, a large quantity of first potential barrier reducing ions may segregate on the bottom interface of the first contact layer. That is, the first potential barrier reducing ions may segregate at the interface between the first contact layer and the first cover layer 26a. Thus, a first dipole layer may be formed in the interface layer between the first contact layer and the first cover layer 26a. The first dipole layer may generate an electric field having a direction same as the motion direction of electrons. Thus, the height and the width of the potential barrier for carriers in the first cover layer 26 to transit to the metal layer may be reduced; and the carriers may directly transit to metal. That is, the Schottky barrier width and the height ($\Phi$Bn) may be reduced. Accordingly, the parasitic resistance ($\rho$c) of the first source region and the first drain region of the subsequently formed P-type FinFET may be reduced; and the performance of the P-type FinFET may be enhanced.

During the second thermal annealing process, the second metal layer and the second cover layer 26b may be fused together; and the metal silicide may be formed. That is, the second contact layer may be formed. The second contact layer may be able to reduce the contact resistance between the second source region and the subsequently formed second source metal via, and the contact resistance between the second drain region and the subsequently formed second drain metal via.

In one embodiment, the thickness of the second cover layer 26b may be greater than the thickness of the second contact layer. Because the second cover layer 26b may be doped with phosphorous ions, the resistance of the second cover layer 26b may be substantially small. Thus, the contact resistance between the second source metal via and the second source region, and the contact resistance between the second drain metal via and the second drain region may not be affected.

During the second thermal annealing process for forming the second contact layer, the second potential barrier reducing ions may have a relatively small solid solubility in the second contact layer and a relative large solid solubility in the second cover layer 26b. Thus, during the second thermal annealing process, a large quantity of second potential barrier reducing ions may segregate on the bottom interface of the second contact layer. That is, the second potential barrier reducing ions may segregate at the interface between the second contact layer and the second cover layer 26b. Thus, a second dipole layer may be formed in the interface layer between the second contact layer and the second cover layer 26b. The second dipole layer may generate an electric field having a direction same as the motion direction of electrons. Thus, the height and the width of the potential barrier for carriers in the second cover layer 26b to transit to the metal layer may be reduced; and the carriers may directly transit to metal. That is, the Schottky barrier width and the height ($\Phi$Bn) may be reduced. Accordingly, the parasitic resistance ($\rho$c) of the second source region and the second drain region of the subsequently formed N-type FinFET may be reduced; and the performance of the N-type FinFET may be enhanced.

When the second potential barrier reducing ions doped into the second cover layer 26b are one or more of S ions, Se ions, As ions and Sb ions. The doping dosage of the second potential barrier reducing ions may be equal to or greater than approximately 1E13 atom/cm$^2$, and smaller than or equal to approximately 1E14 atom/cm$^2$. The doping energy of the second potential barrier reducing ion implantation process may be equal to or greater than approximately 5 KeV, and smaller than or equal to approximately 30 KeV. The energy of the second potential barrier reducing ion implantation process may be the total energy of the one or more doping ions. If the doping dosage and/or the doping energy of the second potential barrier reducing ion implantation process is significantly large, excessive crystal defects may be generated in the second cover layer 26b. If the doping dosage and/or the doping energy of the second potential barrier reducing ion implantation process is substantially small, the reduction of the parasitic resistance on the second source region and the second drain region of the subsequently formed N-type FinFET may be not enough.

If the second potential barrier reducing ions are Ge ions, it may be difficult to form the metal silicide layer during the second thermal annealing process. Thus, the doping dosage of the Ge ions in the second cover layer 26b may be relatively low. In one embodiment, the doping dosage of the first potential barrier reducing ions (Ge ions) may be equal to or greater than approximately 1E13 atom/cm$^2$, and smaller than or equal to approximately 1E14 atom/cm$^2$. If the doping dosage and/or the doping energy of the second potential barrier reducing ion implantation process is significantly large, excessive crystal defects may be generated in the second cover layer 26b; and it may also affect the subsequent formation of metal silicide. If the doping dosage and/or the doping energy of the second potential barrier reducing ion implantation process is substantially small, the reduction of the parasitic resistance on the second source region and the second drain region of the subsequently formed N-type FinFET may be not enough.

If the second potential barrier reducing ions are a mixture of Ge ions and the other potential barrier reducing ions, the total doping dosage of the first potential barrier reducing ions may be equal to or greater than 1E13 atom/cm$^2$, and smaller than or equal to 1E15 atom/cm$^2$. The concentration of Ge ions in the mixture may be the minimum one.

The second potential barrier reducing ions may segregate during the RTA process for forming the metal silicide; and the second potential barrier reducing ions may segregate at interface between the second contact layer and the second cover layer 26b. Further, the second dipole layer may formed at the interface between the second contact layer and the second cover layer 26b. If the second potential barrier reducing ions are doped into the second stress layer 21b, the second potential barrier reducing ions may not segregate; and the second dipole layer may not be formed.

In certain other embodiments, the thickness of the second contact layer is equal to the second cover layer 26b. Thus, during the second thermal annealing process, a large quantity of second potential barrier reducing ions may segregate on the bottom interface of the second contact layer. That is, the second potential barrier reducing ions may segregate at the interface between the second contact layer and the second cover layer 26b. Thus, a second dipole layer may be formed in the interface layer between the second contact layer and the second cover layer 26b. The second dipole layer may generate an electric field having a direction same as the motion direction of electrons. Thus, the height and the width of the potential barrier for carriers in the second cover layer 26b to transit to the metal layer may be reduced; and the carrier may directly transit to metal. That is, the Schottky barrier width and the height (ΦBn) may be reduced. Accordingly, the parasitic resistance (ρc) of the second source region and the second drain region of the subsequently formed N-type FinFET may be reduced; and the performance of the N-type FinFET may be enhanced.

When the first potential barrier reducing ions are identical to the second barrier reducing ions, for example, the first potential barrier reducing ions and the second potential barrier reducing ions are both Ge ions, the first potential barrier reducing ion implantation and the second potential barrier reducing ion implantation may be performed simultaneously. Accordingly, the processes for forming the first patterned photoresist layer and the second patterned photoresist layer may be omitted.

In one embodiment, after performing the source and drain thermal annealing process on the first stress layer 25a having the first source and drain ions and the second stress layer 25b having the second source and drain ions, the first potential barrier reducing ion implantation process may performed on the first cover layer 26a and the second potential barrier reducing ion implantation process may be performed on the second cover layer 26b. If the first potential barrier reducing ion implantation process is performed firstly; and then the source and drain thermal annealing process is performed, the first potential barrier reducing ions may diffused into the first stress layer 25a during the subsequent first thermal annealing process for forming the first contact layer. Thus, the first dipole layer may not be formed. Accordingly, the parasitic resistance on the first source region and the first drain region may not be reduced.

Similarly, if the second potential barrier reducing ion implantation process is performed firstly; and then the source and drain thermal annealing process is performed, the second potential barrier reducing ions may diffuse into the second stress layer 25b during the subsequent second thermal annealing process for forming the second contact layer. Thus, the second dipole layer may not be formed. Accordingly, the parasitic resistance on the second source region and the second drain region may not be reduced.

Further, after forming the first contact layer and the second contact layer, a first source metal via (not shown) and a first drain metal via (not shown) may be formed in the first through-holes; and a second source metal via (not shown) and a second drain metal via (not shown) may be formed in the second through-holes. The first source metal via, the first drain metal via, the second source metal via, and the second drain metal via may be made of any appropriate metal material. In one embodiment, the first source metal via, the first drain metal via, the second source metal via, and the second drain metal via are made of W. Thus, the first source metal via, the first drain metal via, the second source metal via, and the second drain metal via may be formed by filling W in the first through-holes and the second through-holes.

Thus, a semiconductor structure having a plurality of FinFETs may be formed by the above disclosed processes and methods; and the corresponding semiconductor structure may refer to FIG. 7 and FIG. 20. As shown in FIG. 7 and FIG. 20, the semiconductor structure includes a semiconductor substrate having a PMOS region "A" and an NMOS region "B"; and a first fin 21a formed on the semiconductor substrate in the PMOS region "A" and a second fin 21b formed on the semiconductor substrate in the NMOS region "B". Further, the semiconductor structure may also include a first gate structure 21a formed over the first fin 21a; and a second gate structure 22b formed over the second fin 21b.

Further, the semiconductor structure may include a first stress layer 25a formed on the first fin 21a at both sides of the first gate structure 22a; and a second stress layer 25b formed on the second fin 21b at both sides of the second gate structure 22b. Further, the semiconductor structure may also include a first contact layer (not shown), of which a bottom interface has a first dipole layer, formed on the first stress layer 25a; and a second contact layer (not shown), of which a bottom interface has a second dipole layer, formed on the second stress layer 25b. The detailed structures and intermediate structures are described above with respect to the fabrication processes.

According to the disclosed methods and structures, during the first thermal annealing process for forming the first contact layer, the first potential barrier reducing ions may have a relatively small solid solubility in the first contact layer and a relative large solid solubility in the first cover layer. Thus, during the first thermal annealing process, a large quantity of first potential barrier reducing ions may segregate at the bottom interface of the first contact layer. That is, the first potential barrier reducing ions may segregate at the interface between the first contact layer and the first cover layer. Thus, a first dipole layer may be formed in the interface layer between the first contact layer and the first cover layer. The first dipole layer may generate an electric field having a direction same as the motion direction of electrons. Thus, the height and the width of the potential barrier for carriers in the first cover layer to transit to the metal layer may be reduced; and the carriers may directly transit to the metal layer. That is, the Schottky barrier width and the height may be reduced. Accordingly, the parasitic resistance on the first source region and the first drain region of the subsequently formed P-type FinFET may be reduced; and the performance of the P-type FinFET may be enhanced.

Further, during the second thermal annealing process for forming the second contact layer, the second potential barrier reducing ions may have a relatively small solid solubility in the second contact layer and a relative large solid solubility in the second cover layer. Thus, during the second thermal annealing process, a large quantity of second potential barrier reducing ions may precipitate on the bottom interface of the second contact layer. That is, the second potential barrier reducing ions may segregate at the interface between the second contact layer and the second cover layer. Thus, a second dipole layer may be formed in the interface layer between the first contact layer and the second cover layer. The second dipole layer may generate an electric field having a direction same as the motion direction of electrons. Thus, the height and the width of the potential barrier for carriers in the second cover layer to transit to the metal layer may be reduced; and the carriers may directly transit to the metal layer. That is, the Schottky barrier width and the height may be reduced. Accordingly, the parasitic resistance of the second source region and the second drain region of the subsequently formed N-type FinFET may be reduced; and the performance of the N-type FinFET may be enhanced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure having a plurality of FinFETs, comprising:
   providing a semiconductor substrate having a first region and a second region;
   forming at least a first fin on the semiconductor substrate in the first region and at least a second fin on the semiconductor substrate in the second region;
   forming a first gate structure over the first fin and a second gate structure over the second fin;
   forming a first stress layer on the first fin at both sides of the first gate structure and a first cover layer layered on the first stress layer in the first region;
   forming a second stress layer on the second fin at both sides of the second gate structure and a second cover layer layered on the second stress layer in the second region;
   performing a first potential barrier reducing ion implantation process on the first cover layer, layered on the first stress layer in the first region;
   performing a second potential barrier reducing ion implantation process on the second cover layer, layered on the second stress layer in the second region; and
   forming a first contact layer on the first cover layer and a second contact layer on the second cover layer.

2. The method according to claim 1, wherein forming the first contact layer and the second contact layer further includes:
   forming a first metal layer on the first cover layer and a second metal layer on the second cover layer;
   performing a first thermal annealing process on the first metal layer to form the first contact layer; and
   performing a second thermal annealing process on the second metal layer to form the second contact layer.

3. The method according to claim 1, wherein:
   the first region is a PMOS region; and
   the second region is an NMOS region.

4. The method according to claim 1, wherein:
   doing ions of the first potential barrier reducing ion implantation process include at least one of Al ions, Ga ions, B ions, $BF_2$ ion, Ge ions and In ions.

5. The method according to claim 4, wherein:
   doping ions of the first potential barrier reducing ion implantation process include at least one of Al ions, Ga ions, B ions, $BF_2$ and In ions;
   a doping dosage of the first potential barrier reducing ion implantation process is greater than or equal to 1E13 atom/$cm^2$, and smaller than or equal to 1E14 atom/$cm^2$; and
   an energy of the first potential barrier reducing ion implantation process is greater than or equal to 5 KeV, and smaller than or equal to 30 KeV.

6. The method according to claim 1, wherein:
   doing ions of the second potential barrier reducing ion implantation process include at least one of S ions, Se ions, As ions, Sb ion and Ga ions.

7. The method according to claim 6, wherein:
   doping ions of the second potential barrier reducing ion implantation process include at least one of S ions, Se ions, As ions, and Sb ions;
   a doping dosage of the second potential barrier reducing ion implantation process is greater than or equal to 1E13 atom/$cm^2$, and smaller than or equal to 1E14 atom/$cm^2$; and
   an energy of the second potential barrier reducing ion implantation process is greater than or equal to 5 KeV, and smaller than or equal to 30 KeV.

8. The method according to claim 1, wherein:
   doping ions of the first potential barrier reducing ion implantation process are identical to doping ions of the second potential barrier reducing ion implantation process; and
   the first potential barrier reducing ion implantation process and the second potential barrier reducing ion implantation process are performed simultaneously.

9. The method according to claim 8, wherein:
   doing ions of the first potential barrier reducing ion implantation process and the second potential barrier reducing ion implantation process are Ge ions;
   a doping dosage of the Ge ions is greater than or equal to 1E13 atom/$cm^2$, and smaller than or equal to 1E14 atom/$cm^2$; and
   an energy of the first potential barrier reducing ion implantation process and the second potential barrier reducing ion implantation process are greater than or equal to 5 KeV, and smaller than or equal to 30 KeV.

10. The method according to claim 1, wherein performing the first potential barrier reducing ion implantation process further comprises:
    forming a first patterned photoresist layer covering the semiconductor substrate in the second region and exposing the first region; and
    performing the first potential barrier reducing ion implantation process using the first patterned photoresist layer as a mask.

11. The method according to claim 1, wherein performing the first potential barrier reducing ion implantation process further comprises:
    performing a boron ion implantation process in the first cover layer and the first potential barrier reducing ion implantation process simultaneously.

12. The method according to claim 11, wherein:
    a doping dosage of the boron ions is greater than a doping dosage of the first potential barrier reducing ions.

13. The method according to claim 1, wherein:
    the first cover layer and the second cover layer are made of Si; and
    the first metal layer and the second metal layer are made of Ni.

14. A method for fabricating a semiconductor structure having a plurality of FinFETs, comprising:
    providing a semiconductor substrate having a first region and a second region;
    forming at least a first fin on the semiconductor substrate in the first region and at least a second fin on the semiconductor substrate in the second region;
    forming a first gate structure over the first fin and a second gate structure over the second fin;
    forming a first stress layer on the first fin at both sides of the first gate structure and a first cover layer on the first stress layer;
    forming a second stress layer on the second fin at both sides of the second gate structure and a second cover layer on the second stress layer;
    performing a first potential barrier reducing ion implantation process on the first cover layer;
    performing a second potential barrier reducing ion implantation process on the second cover layer and simultaneously performing a phosphorus ion implantation process in the second cover layer, wherein:
    a doping dosage of the phosphorous ions is greater than a doping dosage of the second potential barrier reducing ions; and forming a first contact layer on the first cover layer and a second contact layer on the second cover layer.

15. The method according to claim 14, wherein:
doping ions used in the first potential barrier reducing ion implantation process include at least one of Al ions, B ion, Ga ions, Ge ions and In ions; and
doping ions used in the second potential barrier reducing ion implantation process include at least one of S ions, Se ions, As ions, and Sb ions.

16. A semiconductor structure having a plurality of FinFETs, comprising:
a semiconductor substrate having a first region and a second region,
at least a first fin formed on the semiconductor substrate in the first region and at least a second fin formed on the semiconductor substrate in the second region;
a first gate structure formed on the first fin and a second gate structure formed on the second fin;
a first stress layer formed on the first fin at both sides of the first gate structure;
a second stress layer formed on the second fin at both sides of the second gate structure;
a first cover layer doped with first potential barrier reducing ions and layered on the first stress layer in the first region;
a second cover layer doped with second potential barrier reducing ions and layered on the second stress layer in the second region;
a first contact layer formed on the first cover layer; and
a second contact layer formed on the second cover layer.

17. The semiconductor structure according to claim 16, wherein:
the first region is a PMOS region;
the second region is an NMOS region;
the first stress layer is made of silicon germanium; and
the second stress layer is made of silicon carbide.

18. The semiconductor structure according to claim 16, wherein:
the first contact layer and the second contact layer are metal silicide layers.

19. The semiconductor structure according to claim 16, wherein the first contact layer and the second contact layer are formed by:
forming a first metal layer on the first cover layer and a second metal layer on the second cover layer;
performing a first thermal annealing process on the first metal layer to form the first contact layer; and
performing a second thermal annealing process on the second metal layer to form the second contact layer.

20. The semiconductor structure according to claim 19, wherein:
the first potential barrier reducing ions include at least one of Al ions, B ion, Ga ions, Ge ions and In ions implanted in the first cover layer; and
the second potential barrier reducing ions include at least one of S ions, As ions, Se ions, Sb ions and Ge ions implanted in the second cover layer.

* * * * *